US007514868B2

(12) United States Patent
Yamazaki et al.

(10) Patent No.: US 7,514,868 B2
(45) Date of Patent: Apr. 7, 2009

(54) DISPLAY DEVICE AND METHOD OF FABRICATING THE DISPLAY DEVICE

(75) Inventors: Shunpei Yamazaki, Tokyo (JP); Hideomi Suzawa, Kanagawa (JP); Ichiro Uehara, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/827,709

(22) Filed: Apr. 20, 2004

(65) Prior Publication Data
US 2004/0195964 A1    Oct. 7, 2004

Related U.S. Application Data

(62) Division of application No. 09/953,765, filed on Sep. 17, 2001, now Pat. No. 6,739,931.

(30) Foreign Application Priority Data
Sep. 18, 2000   (JP) .............................. 2000-282312

(51) Int. Cl.
*H05B 33/00* (2006.01)
(52) U.S. Cl. ........................... 313/512; 313/503
(58) Field of Classification Search ................ 313/422, 313/477 R, 634, 498–512
See application file for complete search history.

(56) References Cited

U.S. PATENT DOCUMENTS

| | | | |
|---|---|---|---|
| 4,342,945 A | 8/1982 | Ketchpel | 313/505 |
| 4,356,429 A | 10/1982 | Tang | 313/503 |
| 4,411,735 A | 10/1983 | Belani | 156/659.1 |
| 4,539,507 A | 9/1985 | VanSlyke et al. | 313/504 |
| 4,670,690 A | 6/1987 | Ketchpel | 313/505 |
| 4,720,432 A | 1/1988 | VanSlyke et al. | 428/457 |

(Continued)

FOREIGN PATENT DOCUMENTS

EP    0 220 470    5/1987

(Continued)

OTHER PUBLICATIONS

Tsutsui, T., et al, "Electroluminescence in Organic Thin Films," Photochemical Processes in Organized Molecular Systems, pp. 437-450, (1991).

(Continued)

*Primary Examiner*—Joseph L Williams
(74) *Attorney, Agent, or Firm*—Cook Alex Ltd.

(57) ABSTRACT

In an EL element having an anode, an insulating film (bump) formed on the anode, and an EL film and a cathode formed on the insulating film, each of a bottom end portion and a top end portion of the insulating film is formed so as to have a curved surface. The taper angle of a central portion of the insulating film is set within the range from 35° to 70°, thereby preventing the gradient of the film forming surface on which the EL film and the cathode are to be formed from being abruptly changed. On the thus-formed film forming surface, the EL film and the cathode can be formed so as to be uniform in thickness, so that occurrence of discontinuity in each of EL film and the cathode is prevented.

54 Claims, 19 Drawing Sheets

U.S. PATENT DOCUMENTS

| | | | |
|---|---|---|---|
| 4,769,292 A | 9/1988 | Tang et al. | 428/690 |
| 4,885,211 A | 12/1989 | Tang et al. | 428/457 |
| 4,950,950 A | 8/1990 | Perry et al. | 313/504 |
| 5,047,687 A | 9/1991 | VanSlyke | 313/503 |
| 5,059,861 A | 10/1991 | Littman et al. | 313/503 |
| 5,059,862 A | 10/1991 | VanSlyke et al. | 313/503 |
| 5,061,617 A | 10/1991 | Maskasky | 430/569 |
| 5,063,327 A | 11/1991 | Brodie et al. | 313/482 |
| 5,073,446 A | 12/1991 | Scozzafava et al. | 428/323 |
| 5,151,629 A | 9/1992 | VanSlyke | 313/504 |
| 5,232,549 A | 8/1993 | Cathey et al. | 456/633 |
| 5,294,869 A | 3/1994 | Tang et al. | 313/504 |
| 5,294,870 A | 3/1994 | Tang et al. | 313/504 |
| 5,550,066 A | 8/1996 | Tang et al. | |
| 5,640,067 A | 6/1997 | Yamauchi et al. | 313/504 |
| 5,684,365 A | 11/1997 | Tang et al. | 315/169.3 |
| 5,839,456 A | 11/1998 | Han | 134/104.1 |
| 5,929,948 A | 7/1999 | Ohori et al. | |
| 5,962,962 A | 10/1999 | Fujita et al. | 313/412 |
| 6,037,712 A | 3/2000 | Codama et al. | 313/498 |
| 6,091,196 A | 7/2000 | Codama | |
| 6,107,158 A | 8/2000 | Zheng et al. | 438/424 |
| 6,120,338 A | 9/2000 | Hirano et al. | 445/24 |
| 6,160,272 A | 12/2000 | Arai et al. | |
| 6,222,315 B1 | 4/2001 | Yoshizawa et al. | 313/509 |
| 6,246,179 B1 | 6/2001 | Yamada | |
| 6,274,887 B1 | 8/2001 | Yamazaki et al. | |
| 6,306,559 B1 | 10/2001 | Tanamura et al. | 430/315 |
| 6,380,673 B1 | 4/2002 | Sekiya et al. | 313/504 |
| 6,403,289 B1 | 6/2002 | Tanaka et al. | 430/329 |
| 6,475,836 B1 | 11/2002 | Suzawa et al. | 438/149 |
| 6,830,494 B1 | 12/2004 | Yamazaki et al. | |
| 2001/0023661 A1 | 9/2001 | Hiroki et al. | |
| 2002/0027414 A1 | 3/2002 | Sekiya et al. | 313/504 |
| 2002/0089282 A1 | 7/2002 | Kijima et al. | |
| 2005/0035708 A1 | 2/2005 | Yamazaki et al. | |
| 2005/0174041 A1 | 8/2005 | Li | |

FOREIGN PATENT DOCUMENTS

| | | |
|---|---|---|
| EP | 0 717 445 A2 | 6/1996 |
| EP | 0 781 075 A1 | 6/1997 |
| EP | 1 006 587 A2 | 6/2000 |
| JP | 62-099783 | 5/1987 |
| JP | 03-250583 | 11/1991 |
| JP | 03-274694 | 12/1991 |
| JP | 05-055389 | 3/1993 |
| JP | 05-299520 | 11/1993 |
| JP | 06-163451 | 6/1994 |
| JP | 07-161816 | 6/1995 |
| JP | 07-297282 | 11/1995 |
| JP | 08-078159 | 3/1996 |
| JP | 08-241048 | 9/1996 |
| JP | 8-338998 | 12/1996 |
| JP | 10-149969 | 6/1998 |
| JP | 10-189525 | 7/1998 |
| JP | 10-255975 | 9/1998 |
| JP | 11-097182 | 4/1999 |
| JP | 2000-091082 | 3/2000 |
| JP | 2000-091083 | 3/2000 |
| JP | 2000-100576 | 4/2000 |
| JP | 2000-113982 | 4/2000 |
| JP | 2000-172198 | 6/2000 |
| JP | 2000-208254 | 7/2000 |
| JP | 2001-015267 | 1/2001 |
| JP | 2001-351787 | 12/2001 |

OTHER PUBLICATIONS

Baldo, M.A. et al, "Highly Efficient Phosphorescent Emission from Organic Electroluminescent Devices," Nature, vol. 395, pp. 151-154, Sep. 10, 1998.

Baldo, M.A. et al, "Very High-Efficiency Green Organic Light-Emitting Devices Based on Electrophosphorescence," Applied Physics Letters, vol. 75, No. 1, pp. 4-6, Jul. 5, 1999.

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, pp. L 1502-L 1504, Dec. 15, 1999.

US PTO Office Action re U.S. Appl. No. 11/293,986, dated Nov. 21, 2006.

Notice of Allowance dated Aug. 1, 2008, for co-pending U.S. Appl. No. 11/293,986.

Office Action re U.S. Appl. No. 11/293,986, dated Jan. 2, 2008.

Amendment C (after final), re U.S. Appl. No. 11/293,986, dated Oct. 15, 2007 (with pending claims).

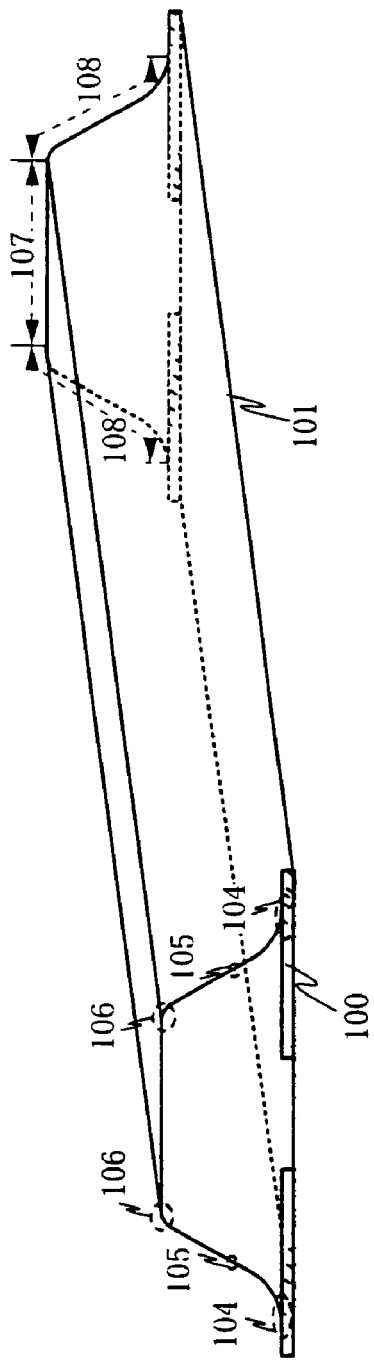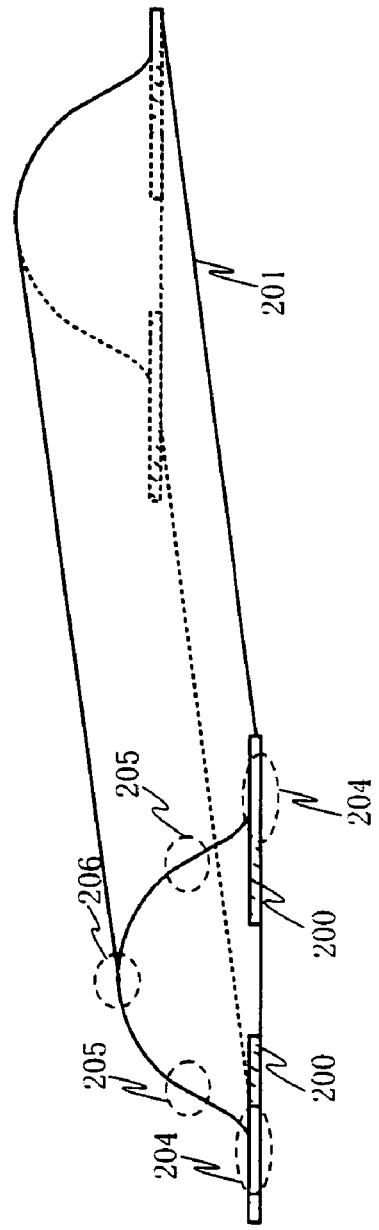
Fig. 20A
Fig. 20B

DISPLAY DEVICE AND METHOD OF FABRICATING THE DISPLAY DEVICE

This application is a divisional of U.S. application Ser. No. 09/953,765, filed on Sept. 17, 2001 now U.S. Pat. No. 6,739,931.

BACKGROUND OF THE INVENTION

1. Field of the Invention

The present invention relates to a display device including an element having a thin film of a chemical compound capable of electroluminescence (EL) (which film hereinafter referred to as "EL film") (which element hereinafter referred to as "EL element"), and to a method of fabricating the display device.

EL comprises phosphorescence caused at the time of transition from a triplet excited state to a ground state and fluorescence caused at the time of transition from a singlet excited state to a ground state.

An inorganic material or an organic material may be used to form an EL film. "Organic EL film" refers to a film of an organic material formed as an EL film. "Organic EL element" refers to an EL element having an organic EL film interposed between electrodes.

In this specification, "thin-film transistor (TFT) device" refers to a semiconductor device having at least three electrodes. These electrodes comprise a gate electrode, a source electrode, and a drain electrode. Each of the source electrode and the gate electrode may also serve a wiring function in some case.

2. Description of the Related Art

Display devices using an organic EL film can be reduced in weight and thickness in comparison with conventional CRTs, and application of such display devices to various uses is being advanced. Portable telephones and personal portable information terminals (personal digital assistants: PDAs) capable of being connected to the Internet have been developed and the amount of information to be visualized on a display device has become markedly large. Under these circumstances, there is an increased demand for multicolor and/or high-resolution display devices.

As a means to achieve improved resolution of a display device, a method is adopted in which voltage is applied to an EL film by means of active elements such as thin-film transistors (TFTs).

Display devices having pixel portion formed of EL elements are of a self-light-emitting type and therefore require no such light source as a backlight used for liquid crystal display devices. EL elements are therefore considered to be a promising means for realizing lightweight thin display devices.

EL elements are ordinarily constructed in such a manner that an EL film is formed over anodes formed in correspondence with pixels, and a cathode is formed as a common electrode on the EL film. In EL elements constructed in such a manner, however, a discontinuity can be easily caused in the EL film at a side surface of the anode, because the thin EL film having a thickness of 30 to 150 nm is formed over the anode having an increased thickness of about 200 nm, which is selected to set a low resistance. If a discontinuity is caused in the EL film, the anode and the cathode are short-circuited, light emission from the corresponding EL film portion is thereby made impossible, and a black-dot defect results.

A structure such as shown in section in FIG. 18 has been proposed by considering this problem. FIG. 18 is a cross-sectional view of a conventional EL element. An end of an anode 1000 is covered with an insulating film 1001 for the purpose of preventing discontinuity in an EL film 1002 and, hence, short-circuiting between the anode and a cathode 1003. The insulating film provided at the end of the anode is generally called a bump.

The structure shown in the cross-sectional view of FIG. 18, however, entails several problems in an actual fabrication process. If the side surface of insulating film 1001 is linear as shown in FIG. 18, discontinuity is liable to occur in the EL film at a joint 1004 between the upper surface of the anode and the side surface of the insulating film. That is, failure of deposition of the material of EL film 1002 occurs in a place where the gradient of the film forming surface of the EL film changes abruptly, thereby forming a gap in the EL film. Through this gap, the anode and the cathode are short-circuited. Even if discontinuity does not occur in the EL film, the thickness of the EL film may be reduced at the joint 1004 between the upper surface of the anode and the side surface of the insulating film. In such a case, an electric field is converged at the thinner portion of the EL film, so that light emission is caused only at the thinner portion.

In a case where the cathode on the insulating film is electrically connected to a wiring below the insulating film via a contact hole formed through the insulating film, discontinuity in the cathode at the side surface of the insulating film may cause failure to apply the necessary potential for display to the cathode.

Also, discontinuity is liable to occur in the EL film and in the cathode in the vicinity 1005 of the line at which the side and upper surfaces of the insulating film 1001 meet each other. Ordinarily, the insulating film (bump) is in the from of a strip such as to cover the space between adjacent pixel portion. If, on the bump formed so as to surround one pixel portion, a discontinuity is formed in the cathode and extends continuously to form a closed curve, then the portion of the cathode within the closed curve serves no electrode function and no voltage is applied to the EL film. That is, a point defect results.

In manufacture of display devices using EL elements in which the number of pixels is increased to improve the resolution, the occurrence of point defects due to short-circuiting between the anodes and cathode or due to discontinuity in the cathode is a factor which causes a reduction in yield or in image quality, and there is an urgent need to cope with this problem. Also, convergence of the electric field due to the state of the EL film locally reduced in thickness makes the luminance of the defective pixel portion different from that of nondefective pixel portion, resulting in a reduction in viewabitity. It is also necessary to cope with this problem.

SUMMARY OF THE INVENTION

An object of the present invention is to provide a display device in which occurrence of discontinuity in an EL film or an electrode is prevented by smoothly forming the film forming surface, and a method of fabricating the display device.

The inventors of the present invention conceived that a method of smoothly changing, through optimization of the shape of the bump, the gradient of the film forming surface of the bump on which the EL film and the cathode are formed could be effective in improving the facility with which the EL film and the cathode are formed so as to be uniform in thickness and in reducing the occurrence of discontinuity in each of the EL film and the cathode as well as in reducing the amount by which the EL film is locally reduced in thickness. The inventors then optimized the shape of the bump to enable the EL film and the cathode to be formed so as to be uniform in thickness and to achieve improved display performance.

Terms used to express the shape of the bump in the description of the present invention will be described with reference to FIGS. 20A and 20B, which are cross-sectional views of bumps showing examples of bump profiles.

For example, of the bump having a flat upper surface 107 as shown in the cross-sectional view of FIG. 20A, the opposite ends of a bottom portion of an insulating film 101 will be referred to as bottom end portions 104; the opposite ends of a top portion of the insulating film will be referred to as top end portions 106; and portions of the surfaces which contact the upper surface 107 of the insulating film and the upper surfaces of anodes 100 existing below the insulating film, which portions have an intermediate height between the heights of the upper surface 107 and the anode surfaces, will be referred to as central portions 105. The surface of the insulating film is divided into the flat upper surface 107 and side surfaces 108.

For example, of the bump having a curved upper surface as shown in the cross-sectional view of FIG. 20B, the opposite ends of a bottom portion of an insulating film 201 will be referred to as bottom end portions 204; a portion of the insulating film about a highest point will be referred to as a top portion 206; and portions of the surfaces which contact the top portion 206 of the insulating film and the upper surfaces of anodes 200 existing below the insulating film, which portions have an intermediate height between those of the top portion 206 and the anode surfaces, will be referred to as central portions 205.

FIG. 1A shows an example of an arrangement in accordance with the present invention. FIG. 1A is a cross-sectional view of an EL element. In the EL element, an insulating film (bump) 101 is selectively formed on an electrode, e.g., anode 100 on one side. EL film 102 is formed on the insulating film and the anode, and a cathode 103 is formed on the EL film. Features of the present invention reside in the shape of the insulating film. The shape of the insulating film will be described with reference to FIG. 2, which is a cross-sectional view showing the sectional profile of the bump.

Note that in the present invention, the thickness (T) of the insulating film 101 is the film thickness of the insulating film when used in a device, and corresponds to the length of a line defined between the upper and lower surfaces of the insulating film and perpendicular to these surfaces.

From the viewpoint of prevention of discontinuity in each of the EL film 102 and the cathode 103, it is preferred that the thickness of the insulating film be not excessively thick, for example, it should be 3.0 μm or less. Also, it is preferable to set the thickness of the insulating film to a value not smaller than 1.0 μm in order to reduce the parasitic capacitance between the cathode 103 formed on the insulating film 101 and a TFT device formed below the insulating film 101. That is, the thickness of the insulating film is preferably within the range from 1.0 to 3.0 μm.

(1) The present invention is characterized in that, in an EL element having an electrode, e.g., anode 100 on one side and insulating film 101 selectively formed on the anode 100, the bottom end portion 104 of the insulating film contacting the upper surface of the anode contacts an ellipse or circle having its center located outside the side surface 108 of the insulating film, and the top end portion 106 connects continuously to the upper surface 107 of the insulating film and contacts an ellipse or circle having its center located inside the side surface 108 of the insulating film (see FIG. 2B). If the lower end portion and the top end portion of the insulating film are formed smoothly as described above, the gradient of the film forming surface changes continuously, so that the occurrence of discontinuity in each of the EL film 102 and the cathode 103 can be prevented. Also, the amount by which the EL film is locally reduced in thickness in the region between the cathode and the anode can be limited, thereby preventing localized convergence of an electric field in the EL film.

The center of the ellipse is the point of intersection of the minor axis and the major axis of the ellipse. The center of the circle is the point of intersection of at least three radial lines perpendicular to lines tangent to the circle at different positions.

(2) In the arrangement described in (1) above, if the central portion 105 of the insulating film has a side surface contacting the side surface of the insulating film forming an angle θ within the range from 35° to 70° from the upper surface of the anode, the occurrence of discontinuity in each of the EL film and the cathode on the side surface 108 of the insulating film can be prevented. In this specification, "central portion" refers to a portion of the surface of the insulating film 101 contacting the upper surface of the insulating film and the upper surface of the anode, which portion has an intermediate height between the height of the upper surface of the insulating film and the height of the upper surface of the anode. In this specification, a surface contacting the side surface of the insulating film will be referred to as "sloped surface", and the angle formed between the sloped surface and the upper surface of the anode will be referred to as "sloped surface taper angle".

Preferably, the sloped surface taper angle of the central portion of the insulating film is within the range from 35° to 70°. If the sloped surface taper angle exceeds 70°, the thickness of the cathode along the side surface of the insulating film becomes excessively small and the possibility of occurrence of discontinuity in the cathode is increased. If the sloped surface taper angle is smaller than 35°, the insulating film (bump) tends to become smaller in thickness as the sloped surface taper angle is reduced. If the film thickness of the insulating film is reduced, the parasitic capacitance between the TFT device below the insulating film and the cathode on the insulating film becomes disadvantageously large.

(3) According to the present invention, an EL element has an electrode, e.g., anode 100 on one side and insulating film 101 selectively formed on the anode 100. The bottom end portion 104 of the insulating film contacts the upper surface of the anode 100 and contacts a curved side surface determined by a center of curvature ($O_1$) and a first radius of curvature ($R_1$) above a tangential line along which the anode and the bottom end portion contact each other. The top end portion 106 of the insulating film connects continuously to the upper surface of the insulating film and has a curved side surface determined by a center of curvature ($O_2$) and a second radius of curvature ($R_2$) below the boundary between the top end portion 106 and the flat upper surface 107 (see FIGS. 2A and 2B).

The bottom end portion of the insulating film has a curved profile such that the gradient of the EL film forming surface changes continuously. The coverage of the EL film formed on the bottom end portion of the insulating film is thereby improved to enable prevention of discontinuity in the EL film on the bottom end portion. The possibility of short-circuiting of the anode and the cathode due to discontinuity in the EL film is reduced thereby. Also, the EL film can be prevented from being locally reduced in thickness. As a result, localized convergence of an electric field in the EL film can be prevented.

In the top end portion 106 of the insulating film, the gradient of a surface contacting the side surface of the insulating film changes continuously with respect to the upper surface of the anode 100. Therefore, the occurrence of discontinuity in each of the EL film and the cathode in the vicinity of the boundary between the upper surface 107 and the side surface 108 of the insulating film can be prevented. In particular, since the occurrence of discontinuity in the cathode can be prevented, it is possible to prevent the occurrence of a point defect which may be caused when a discontinuity in the cathode extends continuously to form a closed curve in a case where the insulating film is formed so as to fully cover the ends of the anode. Also, in a case where the insulating film is formed into a strip such as to cover a part of an end portion of the anode, it is possible to prevent the wiring resistance of the cathode from being increased by a discontinuity in the cathode. Further, it is possible to reduce the possibility of occurrence of discontinuity in the cathode at a side surface of a contact hole formed through the insulating film in a case where the cathode is brought into contact with a wiring below the insulating film via the contact hole.

(4) The present invention is also characterized in that, in the arrangement described in (3) above, the first radius of curvature is within the range from 0.2 to 3.0 μm. If the first radius of curvature ($R_1$) is smaller than 0.2 μm, the side surface of the insulating film 101 contacting the anode 100 rises so steeply as seen in the profile that a problem of difficulty in forming the EL film and the cathode uniformly in thickness on the side surface of the insulating film 101 arises. For example, the gradient of the EL film forming surface changes so abruptly that the thickness of the EL film on the portion of film forming surface corresponding to the abrupt change in the gradient is reduced to cause localized convergence of an electric field in the corresponding portion of the EL film. If the first radius of curvature ($R_1$) exceeds 3.0 μm, the area of a thinner portion of the insulating film is so large that there is a tendency to increase the difficulty in suitably covering the TFT device with the insulating film.

When the first radius of curvature is within the range from 0.2 to 3.0 μm, profile control can easily be performed in either of etching using an aqueous solution of an acid or a base and etching using a reactive gas.

(5) Preferably, in the arrangement described in (3) and (4) above, the sloped surface taper angle θ of the central portion 105 of the insulating film is within the range from 35° to 70°.

(6) Preferably, in the arrangement described in (3), (4) and (5) above, the second radius of curvature ($R_2$) is within the range from 0.2 to 3.0 μm. If the second radius of curvature ($R_2$) is excessively small, the side surface of the insulating film contacting the upper surface of the insulating film 101 is curved so sharply that the effect of preventing discontinuity in the EL film is low even though the top end portion has a curved surface. Therefore it is necessary that the second radius of curvature be at least 0.2 μm.

It is suitable to set the second radius of curvature within the range from 0.2 to 3.0 μm as a radius of curvature controllable in either of etching using an aqueous solution of an acid or a base and etching using a reactive gas in an actual fabrication process.

The radius of curvature or the gradient of each of the bottom end portion, the central portion and the top end portion of the insulating film is set within the above-described range to smoothly form the side surface profile of the insulating film as a whole, thereby improving the reliability with which discontinuity in each of the EL film and the cathode is prevented. It is also possible to limit the amount by which the EL film is locally reduced in thickness on the side surface of the bottom end portion of the insulating film and to thereby prevent convergence of an electric field in the thinner portion of the EL film.

FIG. 1B shows the structure having improved reliability with which discontinuity in the cathode is prevented in comparison with the structure shown in FIG. 1A. Referring to FIG. 1B, insulating film 201 is selectively formed on electrodes, e.g., anodes 200, EL film 202 is formed on the insulating film 201, and cathode 203 is formed on the EL film. The structure shown in FIG. 1B is characterized in that the side surface of the insulating film including that of the top portion of the insulating film is curved.

The sectional profile of the insulating film shown in FIG. 1B will be described in detail with reference to FIGS. 3A and 3B.

The thickness (T) of the insulating film shown in FIG. 3A is the length of a line defined between the top end portion of the insulating film and the bottom surface of the insulating film and perpendicular to the bottom surface. The top end portion has a point on the surface of the insulating film at which the distance between the insulating film surface and the plane on which the insulating film is formed is maximized. Preferably, the thickness of the insulating film is 3.0 μm or less.

(7) The present invention is also characterized in that, in an EL element having an electrode, e.g., anode 200 on one side and insulating film 201 selectively formed on the anode, the bottom end portion 204 of the insulating film contacting the upper surface of the anode has a side surface contacting an ellipse or circle having its center located outside the side surface of the insulating film, and the top end portion 206 contacts an ellipse or circle having its center located inside the side surface of the insulating film (see FIG. 3B).

(8) Specifically, in the arrangement described in (7) above, the sloped surface taper angle of the central portion 205 of the insulating film is within the range from 35° to 70°.

(9) According to the present invention, an EL element has an electrode, e.g., anode on one side and insulating film 201 selectively formed on the anode 200. The bottom end portion 204 of the insulating film contacts the upper surface of the anode 200 and has a curved side surface determined by a center of curvature ($O_1$) and a first radius of curvature ($R_1$) above a tangential line of the anode and the bottom end portion. The top end portion 206 of the insulating film has a curved side surface determined by a center of curvature ($O_2$) and a second radius of curvature ($R_2$) below the top end portion. It is preferred that while the side surface of each of the bottom end portion and the top end portion of the insulating film is curved, the sloped surface taper angle of the central portion 205 of the insulating film is within the range from 35° to 70° (see FIGS. 3A and 3B).

(10) In the arrangement described in (9) above, the first radius of curvature ($R_1$) of the bottom end portion 204 is preferably within the range from 0.2 to 3.0 μm. If the first radius of curvature ($R_1$) is excessively small, the side surface of the insulating film 201 contacting the anode 200 rises so steeply as seen in the profile that the effect of preventing discontinuity and localized thinning of the EL film is reduced, even though the bottom end portion of the insulating film 201 is curved as seen in the sectional profile. Therefore it is necessary that the first radius of curvature be at least 0.2 μm. However, if the first radius of curvature is excessively large, the area of a thinner portion of the insulating film is so large that it is difficult to suitably cover the TFT device with the insulating film. Therefore setting the first radius of curvature to an excessively large value should be avoided in an EL display device. The first radius of curvature of the insulating film is preferably not larger than 3.0 μm. If the first radius of curvature ($R_1$) is within the range from 0.2 to 3.0 μm, profile control can be suitably performed in an actual fabrication process.

(11) According to the present invention, in the arrangement described in (8), (9) and (10) above, the top portion 206 of the insulating film has a curved shape determined by the center of curvature ($O_2$) and the second radius of curvature ($R_2$) below the top portion. If the surface on which the EL film and the cathode are to be formed are formed smoothly as described above, discontinuity in the cathode, which may occur when the film thickness of the cathode on the surface of the insulating film is reduced, can be prevented. The second radius of curvature ($R_2$) of the top portion 206 may be determined by considering the distance between the adjacent pair of anodes. The arrangement shown in FIGS. 1B, 3A, and 3B, in which the surface of the top end portion 206 of the insulating film is curved, is effective in preventing discontinuity in the cathode, which may be caused by an abrupt angular change.

Preferably, the insulating film has such a profile that, as shown in FIGS. 2A and 2B and FIGS. 3A and 3B, the sloped surface taper angle θ of the side surface between the bottom end portion and the top end portion (or top portion) changes continuously through the range from 0°, the angle at the end of the insulating film contacting the electrode, to 70°. If the insulating film has such a profile, discontinuity in each of the EL film and the cathode and convergence of an electric field caused by localized thinning of the EL film can be reliably prevented.

If an organic EL material is used to form the above-described EL film, direct-current drive and low-voltage drive of the EL film can be performed. A display device of low power consumption can be manufactured by using such organic EL material.

While the arrangements for active matrix display devices have been mainly described, the present invention can be applied to either passive matrix display devices or active matrix display devices, because it is possible to effectively prevent discontinuity in the cathode and the EL film and localized thinning of the film thickness of the EL film by selecting the profile of the insulating film.

The description has been made with respect to the case where the electrode below the insulating film is an anode. However, a cathode may alternatively be formed below the insulating film.

BRIEF DESCRIPTION OF THE DRAWINGS

FIGS. 20A and 20B are diagrams for explaining bump profiles in accordance with the present invention.

Figure 1A:
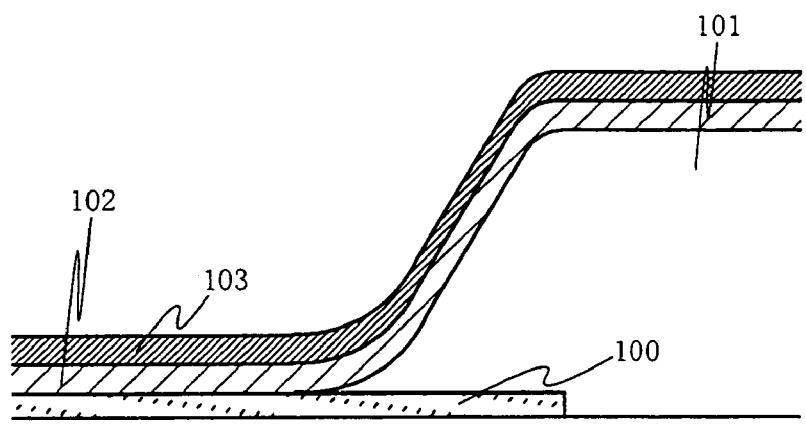
FIGS. 1A and 1B are cross-sectional views of an EL element in accordance with the present invention.

DESCRIPTION OF THE PREFERRED
EMBODIMENTS

Embodiment mode of the present invention will be described below.

A process in which a non-photosensitive polyimide resin film or a non-photosensitive acrylic film is used as an organic material will first be described. The sectional profile of an insulating film shown in FIG. 1A can be formed by gradually changing the flow rates of reactive gases during etching of the insulating film using the reactive gases. An example of a fabrication method in which the sectional profile is formed in such a manner will be described with reference to FIGS. 4A to 4C.

A TFT device is formed on a substrate as a device for switching an organic EL element. In the TFT device, an electrode 416 on the drain side and an electrode 417 on the source side are connected to a semiconductor layer, and a gate electrode 411 is provided above the semiconductor layer. An anode 422 of the organic EL element electrically connected to the electrode 416 on the drain side of the TFT device is formed below the electrode 416. A transparent electroconductive film such as indium-tin oxide (ITO) may be used to form the anode.

In a first step, insulating film 301 is formed over these electrodes. As insulating film, an acrylic resin film or a polyimide resin film may be formed. First, the material of the insulating film is applied to the substrate and is heat-treated at a temperature of 50 to 150° C. for 1 to 5 minutes, thereby removing the solvent contained in the polyimide resin film. The film is further heat-treated in an oven at 200 to 250° C. to imidize the polyimide resin film. Preferably, the film thickness of the polyimide resin film after imidization is within the range from 1.0 to 3.0 µm.

Figure 4A:
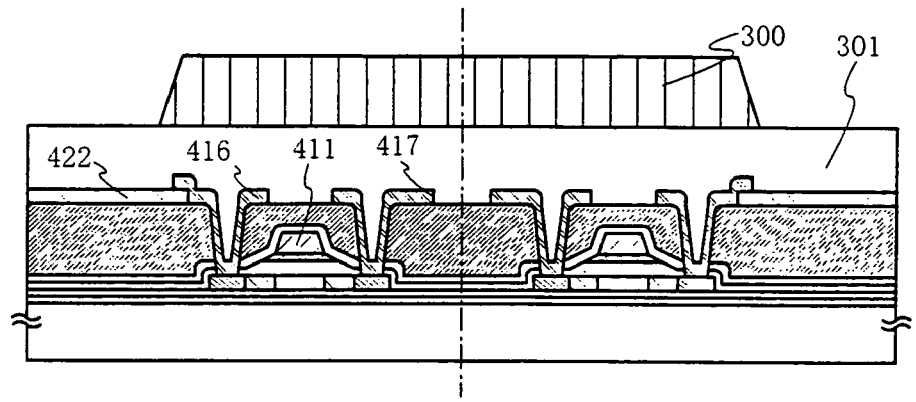
FIGS. 4A to 4C are cross-sectional views for explaining a bump fabrication process in accordance with the present invention (embodiment mode)

In a second step, resist film 300 is patterned on insulating film 301. A photosensitive photoresist film (hereinafter referred to as "resist film") is formed on the polyimide resin film. Preferably, resist film 300 has a tapered profile such that an angle of 50 to 80° is formed between the bottom surface and the side surface of the resist film after patterning (FIG. 4A).

In a third step, the insulating film is etched by using at least a first reactive gas and a second reactive gas. During this etching, the flow rates of the first and second reactive gases is changed with time. A method of etching the polyimide resin film by using a first reactive gas $CF_4$, a second reactive gas $O_2$, and an inert gas He as etching gases will be described by way of example. If the flow rate of the first reactive gas $CF_4$ is higher, polyimide resin film 303 is etched more easily than resist film 302. That is, the depth-(Y) to which polyimide resin film 303 is etched in the film thickness direction becomes larger than the width (X) by which the side surface portion of resist film 302 recedes toward an inner portion of the resist film, and the sloped surface taper angle that is dependent upon Y/X becomes larger. That is, when the gas flow rate of the first reactive gas $CF_4$ is higher, the sloped surface taper angle becomes larger and a steep profile results.

Conversely, when the gas flow rate of the first reactive gas $CF_4$ is lower, the sloped surface taper angle becomes smaller and a gradual profile results.

Consequently, it is possible to smoothly change the sloped surface taper angle of the insulating film by gradually changing the flow rate of the first reactive gas $CF_4$ and the second reactive gas $O_2$.

Figure 4B:
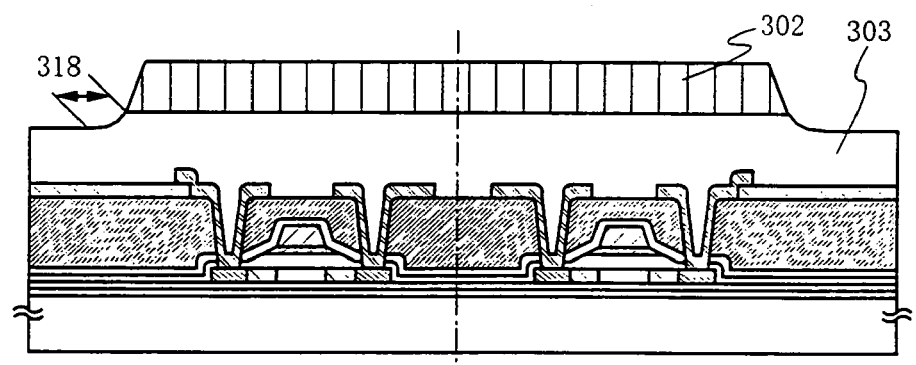

In a first etching step, reactive ion etching (RIE) is performed and the first reactive gas $CF_4$, the second reactive gas $O_2$ and the inert gas He are used as etching gases. At the start of etching, the gas flow rate of $CF_4$, $O_2$, and He is set to 1.5/98.5/40 (sccm). With the lapse of etching time, the flow rate of the first reactive gas $CF_4$ to the second reactive gas $O_2$ is increased so that the gas flow rate of $CF_4$, $O_2$, and He is finally set to 7/93/40 (sccm). The flow rate of the first reactive gas $CF_4$ is relatively increased to increase the sloped surface taper angle of the insulating film. The sloped surface taper angle of the insulating film is continuously changed by fine steps to form the side surface of the insulating film so that the side surface has a curved profile. The radius of curvature of this curved surface will be referred to as "first radius of curvature". Preferably, the first radius of curvature is within the range from 0.2 to 3.0 µm. Thus, a first region 318 in the side surface of the insulating film is formed (FIG. 4B).

Etching conditions under which the first etching step is performed will be referred to as "first etching conditions".

If in the first etching conditions the rate at which the flow rate of the first reactive gas $CF_4$ is changed is reduced, the gradient of the side surface of the insulating film changes gradually, so that the first radius of curvature is increased. Conversely, if the rate at which the flow rate of the first reactive gas $CF_4$ in the first etching is changed is increased, the first radius of curvature is reduced.

Thereafter, etching is performed without removing the resist film. In a second etching step, $CF_4$, $O_2$, and He are also used as etching gases and etching is continued while constantly maintaining the gas flow rate of the first reactive gas $CF_4$, the second reactive gas $O_2$ and the inert gas He at 7/93/40 (sccm). A region where the sloped surface taper angle is constant is thereby formed in the side surface of the insulating film 303. That is, a second region 319 is formed in the side surface of the insulating film. The taper angle of the sloped surface of the insulating film formed in the second etching step is determined by the gas flow rate finally set in the first etching step. If the proportion of the first reactive gas $CF_4$ relative to the second reactive gas $O_2$ is higher, the sloped surface taper angle of the insulating film becomes larger. Preferably, the taper angle of the side surface of the insulating film in the second region 319 is within the range from 35° to 70°.

Since anisotropic etching using the reactive gases is performed in the etching under second etching conditions, the first region 318 of the side surface of the insulating film formed as shown in FIG. 4B is transferred to a lower position in the polyimide resin film while maintaining its profile.

Figure 4C:
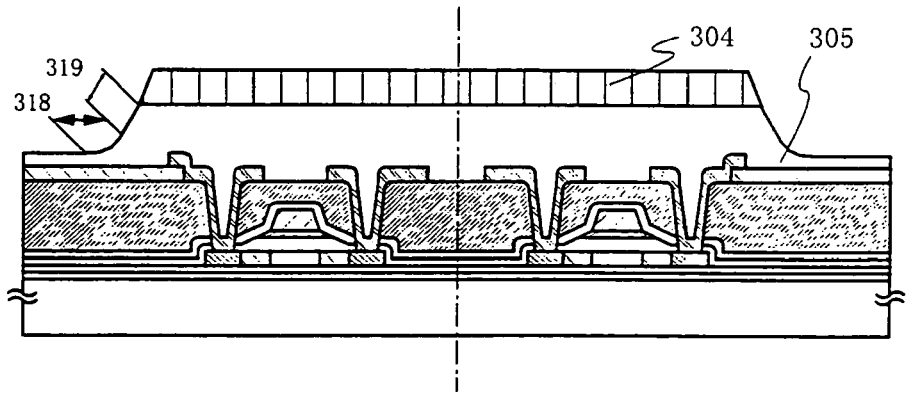

The upper and side surfaces of resist film 304 are etched, so that its thickness is reduced and the side surface recedes toward an inner portion of the resist film (FIG. 4C).

Next, a third etching step is performed. While the resist film is not removed, third etching conditions are set. $CF_4$, $O_2$, and He are also used as etching gases and the ratio of the first reactive gas $CF_4$ to the second reactive gas $O_2$ is reduced with time. For example, the gas flow rate of $CF_4$, $O_2$, and He is changed with time from 7/93/40 (sccm) to 1.5/98.5/40 (sccm). The sloped surface taper angle of the insulating film is gradually reduced to thereby form a curved surface. The radius of curvature of this curved surface will be referred to as "second radius of curvature". A third region 320 of insulating film 307 is formed under the third etching conditions.

Figure 5A:
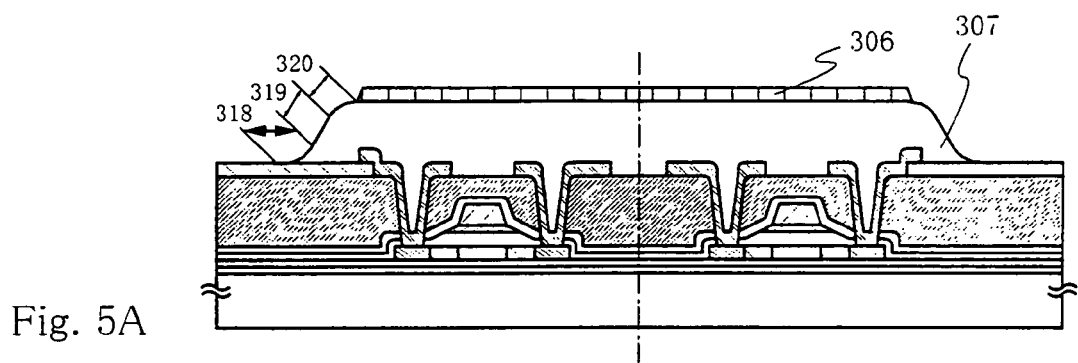
FIGS. 5A and 5B are cross-sectional views for explaining the bump fabrication process in accordance with the present invention (embodiment mode)

The upper and side surfaces of resist film 306 are etched, so that thickness is reduced and the side surface recedes toward an inner portion of the resist film (FIG. 5A).

The first to third etching conditions include common etching conditions such that plasma is generated at a pressure of 65 Pa by applying RF (13.56 MHz) electric power of 500 W, thereby performing etching.

The first region 318, the second region 319 and the third region 320 are formed in the side surface of the insulating film by the above-described steps. The first region includes the bottom end portion of the insulating film, the second region includes the central portion of the insulating film, and the third region includes the top end portion of the insulating film.

Thereafter, resist film 306 is removed in a fourth step, and EL film 423 is formed on the insulating film and the electrodes in a fifth step. Further, cathode 424 is formed on the EL film, thus forming an EL element (FIG. 5B).

Figure 5B:
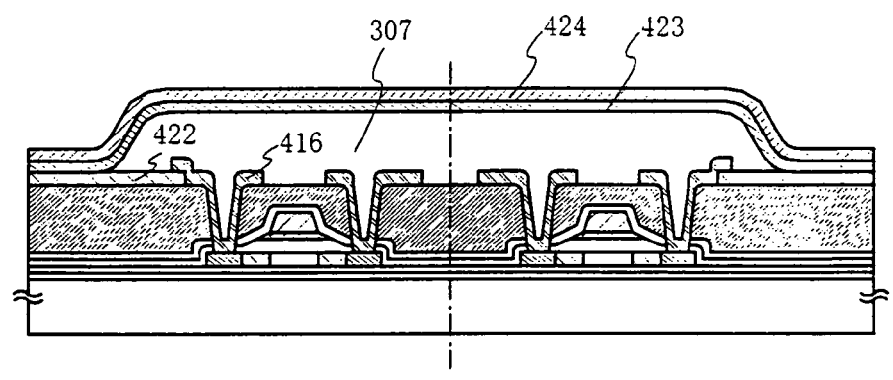
Figure 9A:
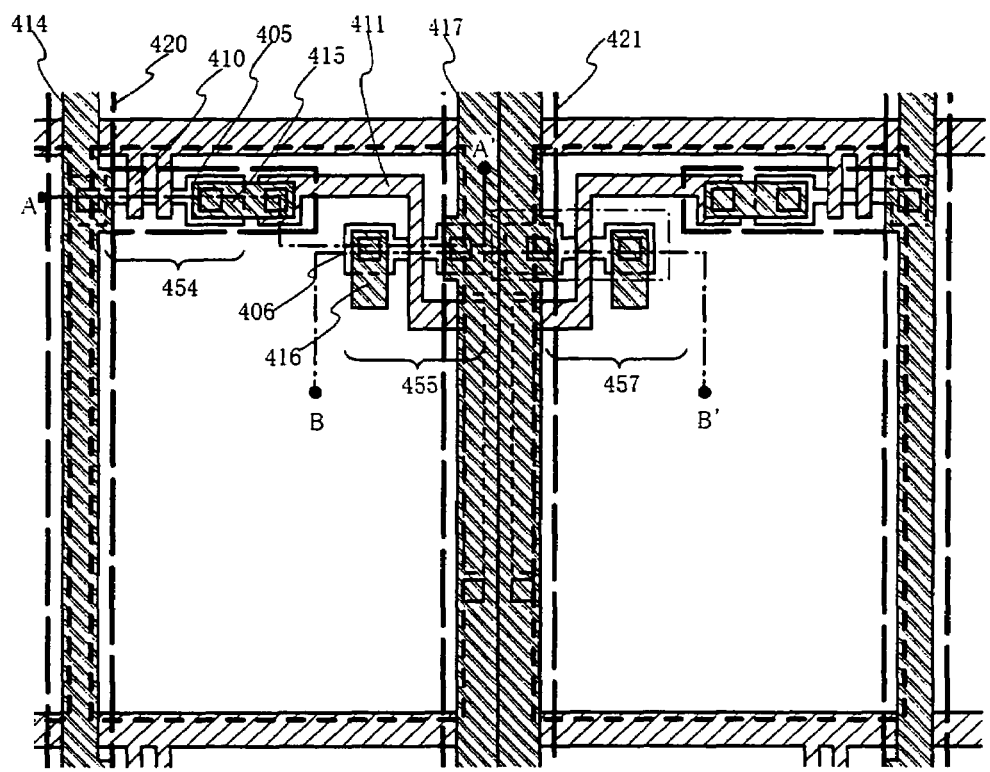
FIGS. 9A and 9B are a top view of the pixel portion of the display device and an equivalent circuit diagram (Embodiment 1)

The cross-sectional view with a dot-dash line B-B' in FIG. 5B corresponds to a cross-sectional view taken along line B-B' in the top view of FIG. 9A. The portions in FIG. 5B corresponding to those in FIG. 9A are indicated by the same reference numerals.

Etching using reactive gases has the advantage of enabling microfabrication. An example of the process using an organic material as insulating film has been described with reference to FIGS. 4A to 5B. However, an inorganic material may alternatively be used as insulating film. For example, in a case where $SiO_2$ film is used as insulating film, use of $CHF_3$ as a first reactive gas and $O_2$ as a second reactive gas is preferred. In the first to third etching steps, the flow rate of the first reactive gas and the second reactive gas is changed as described above. If the flow rate of the first reactive gas $CHF_3$ is relatively increased, the etching of the insulating film in the film thickness direction is promoted to increase the sloped surface taper angle. Thus, even if the materials in the above-described steps are replaced, the first region 318 and the third region 320 of the insulating film can be formed as curved surfaces and the second region 319 can be formed as a sloped surface having a constant gradient, as are those shown in FIG. 5A.

However, because irregularities can be reflected in the surface of the inorganic insulating film, the surface of the inorganic insulating film may have irregularities due to wiring conductors of TFT devices, etc. In such a case, the surface of the inorganic insulating film may be polished by chemical mechanical polish (CMP) before the formation of resist film and the inorganic insulating film may be etched thereafter for forming the bump.

A method of forming the profile shown in FIG. 1B by using a polyimide resin film will also be described with reference to FIGS. 6A to 6D.

The polyimide resin film is an organic film having polyamic acid as a main component before being thermoset, and becomes a polyimide film by dehydrocondensation during thermosetting. In the example of the process shown in FIGS. 4A to 5B, there is no need for particular distinction between the two states and each of the resin films before and after thermosetting has been referred to as polyimide resin film. In the process shown in FIGS. 6A to 6D, however, the difference between the chemical characteristics of polyamic acid and polyimide is utilized. Therefore the description will be made below by expressly mentioning the difference.

In a first step, the material of organic film 309 having polyamic acid as a main component is applied over the electrodes.

Figure 6A:
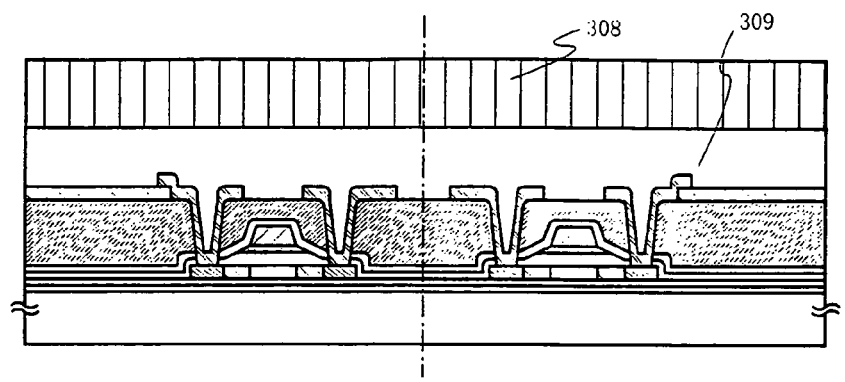
FIGS. 6A to 6D are cross-sectional views for explaining another bump fabrication process in accordance with the present invention (embodiment mode)

In a second step, a heat treatment is performed at a temperature of 50 to 150° C. for 1 to 5 minutes to remove the solvent in the organic film. In a third step, resist film 308 is formed on organic film 309. The thickness of the resist film is preferably within the range from 0.5 to 3.0 μm. In a fourth step the resist film is exposed to radiation of ultraviolet rays through the photomask (FIG. 6A).

Figure 6B:
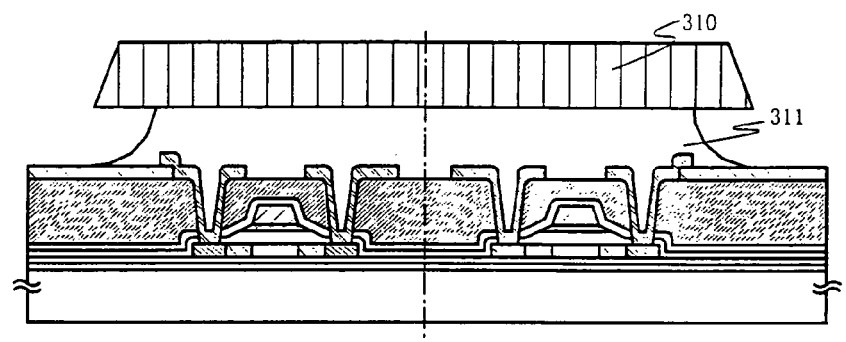

In a fifth step, the resist film and the organic film on the substrate are immersed in a basic developer, thereby performing development. As this developer, a tetramethylammonium hydroxide (TMAH) developer having a concentration of 2.0 to 6.0% may be used. Of the resist film, the portion exposed to radiation of ultraviolet rays is first dissolved in the developer. Thereafter, organic resin film 311 having polyamic acid has a main component is isotropically etched by the basic developer with the resist film as a mask. Most of the organic resin film 311 under the resist film 310 remains by being protected by the resist film. However, portions of the organic resin film below edge portions of the resist film are etched by the isotropic etching to have curved side surfaces (FIG. 6B).

In a sixth step, the resist film is immersed in a resist film solvent to dissolve and remove the resist film. The resist film solvent is, for example, N-methyl-2-pyrrolidone (NMP).

Figure 6C:
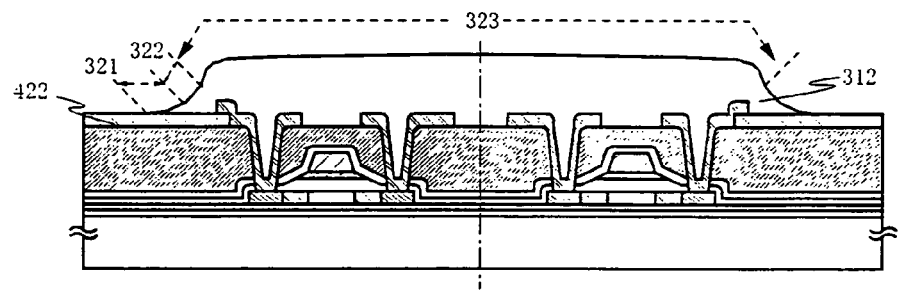

In a seventh step, the organic film is imidized by dehydrocondensation at a temperature in the range from 180 to 350° C. for 1 to 3 hours. The organic film having polyamic acid as a main component is thereby changed chemically into polyimide resin film. During imidization, the polyimide resin film shrinks inwardly, so that the surface of polyimide resin film 312 is rounded (FIG. 6C).

Thus, a first region 321, a second region 322 and a third region 323 are formed in the surface of the insulating film. The first region 321 is a curved surface including the surface of the bottom end portion. The second region 322 includes the central portion of the side surface of the insulating film. The third region 323 includes the top end portion of the insulating film.

The second region 322 is rounded more or less by heat shrinkage of the polyimide film. Preferably, after rounding, the angle between the surface of the central portion along the side surface of the insulating film and the upper surface of the anode 422 is within the range from 35° to 70°.

The third region 323 is rounded by heat shrinkage and the insulating film surface in this region including the top end portion and a side surface portion of the insulating film is formed as a curved surface.

Figure 6D:
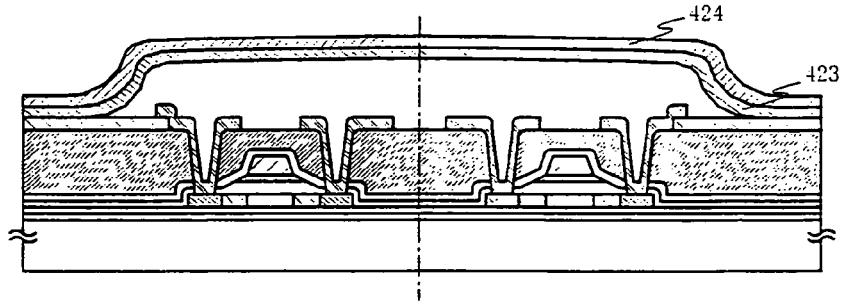

In an eighth step, EL film 423 is formed on the polyimide resin film, and cathode 424 is formed on the EL film (FIG. 6D).

Another example of the fabrication method in which the sectional profile shown in FIG. 1A is formed will be described.

For example, a resist film is patterned on the insulating film, the insulating film is isotropically etched, and the resist film is removed. The insulating film is then etched by reactive ion etching (RIE). Reactive gases can easily impinge on the portion of the insulating film where the side surface and the upper surface thereof contact each other. Therefore the insulating film can have a curved surface in the vicinity of the tangential line along which the side surface and the upper surface of the insulating film contact each other.

A process based on this method will be described with reference to FIGS. 19A to 19E, which are cross-sectional views for explaining the process of forming a bump.

Figure 19A:
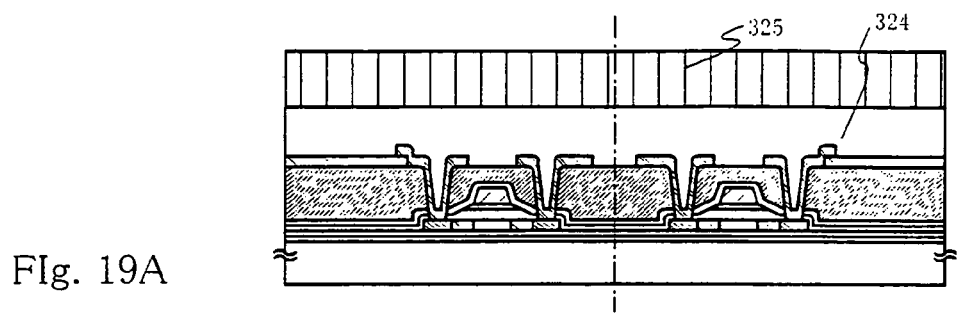
FIGS. 19A to 19E are cross-sectional views for explaining a bump fabrication process in accordance with the present invention (embodiment mode)

First, insulating film 324 is formed over electrodes, and resist film 325 is formed on the insulating film 324. The thickness of the insulating film is set to 1 to 3 μm and the thickness of the resist film is set to 0.5 to 5 μm. The insulating film is formed by applying and thermosetting a polyimide resin film or acrylic resin film (FIG. 19A).

Figure 19B:
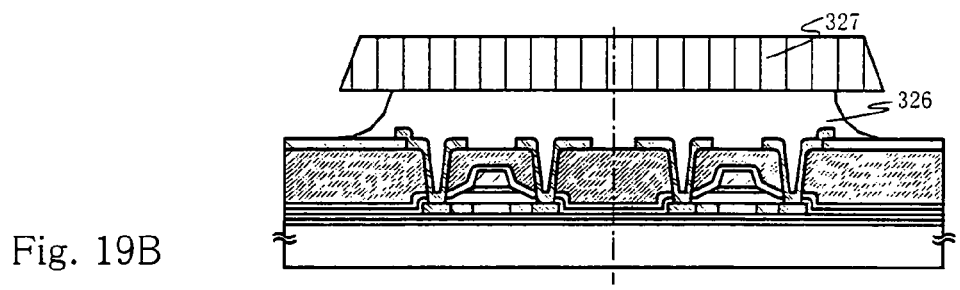
Figure 19C:
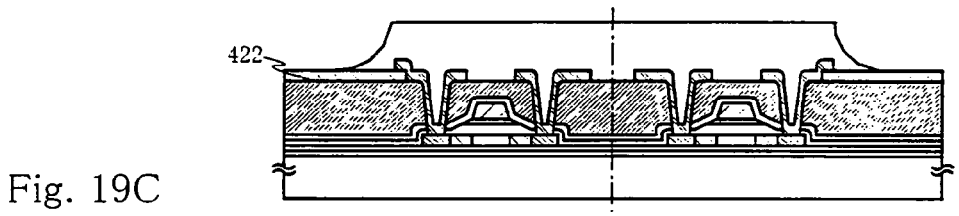

Next, the resist film undergoes exposure and development. Resist film 327 is formed by being superposed on end portions of adjacent pixel electrodes and the gap between the pixel electrodes. Then the insulating film is isotropically etched. A well-known method may be used to perform isotropic etching. For example, it is known that in a case where etching is performed by generating plasma, etching progresses isotropically if the etching atmosphere pressure is increased (Practical Dry Etching Technique, REALIZE INC. p.40). The insulating film is removed under edge portions of the resist film by etching, so that insulating film 326 having curved side surfaces remains (FIG. 19B).

Figure 18:
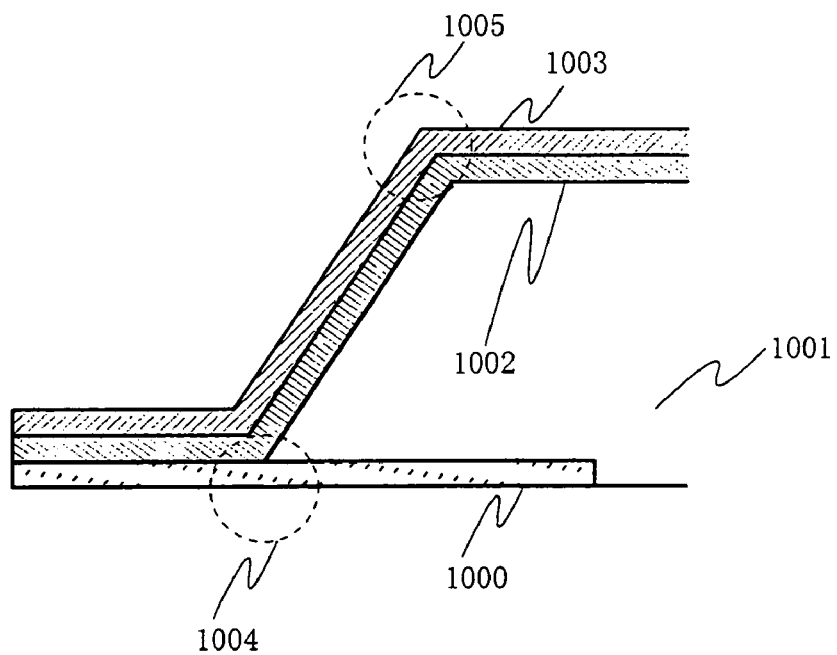
FIG. 18 is a diagram showing a conventional bump profile.

Next, the resist film is removed (FIG. 18C).

Figure 19D:
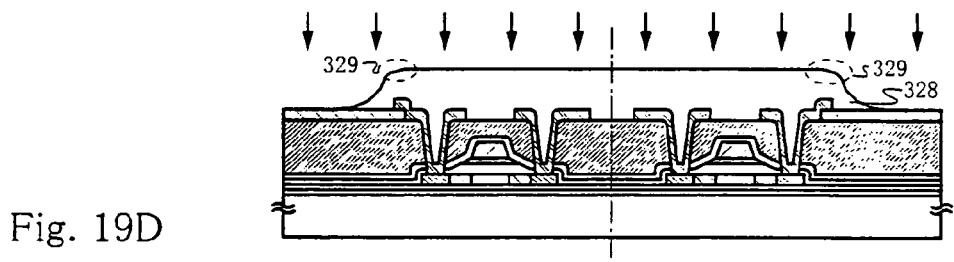

The insulating film is thereafter etched by reactive ion etching (RIE). Plasma of an ionization degree of 0.1 to 1% is formed at an atmosphere pressure of 0.1 to 1 Torr. In etching based on the RIE method, etching progresses by chemical reaction between reactive gases and the insulating film. Since the reactive gases can easily impinge on the portion where the side surface and the upper surface of the insulating film contact each other (top end portion 329 of the insulating film), the top end portion of insulating film 328 is formed into a rounded shape (FIG. 19D).

Figure 19E:
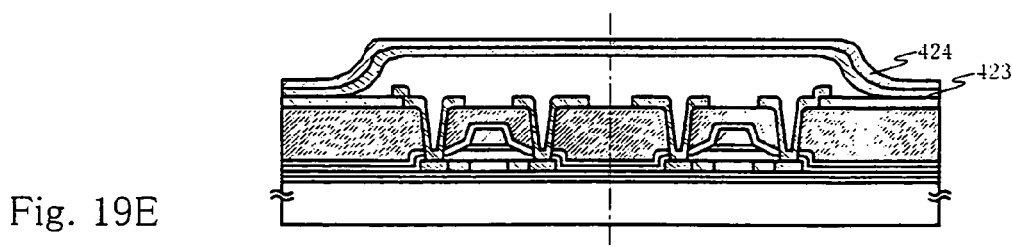

EL film 423 and cathode 424 are thereafter formed (FIG. 19E).

Figure 1B:
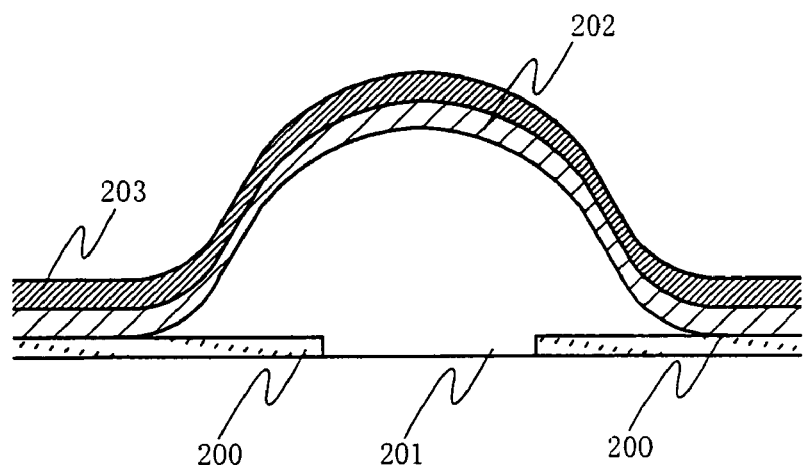
Figure 2A:
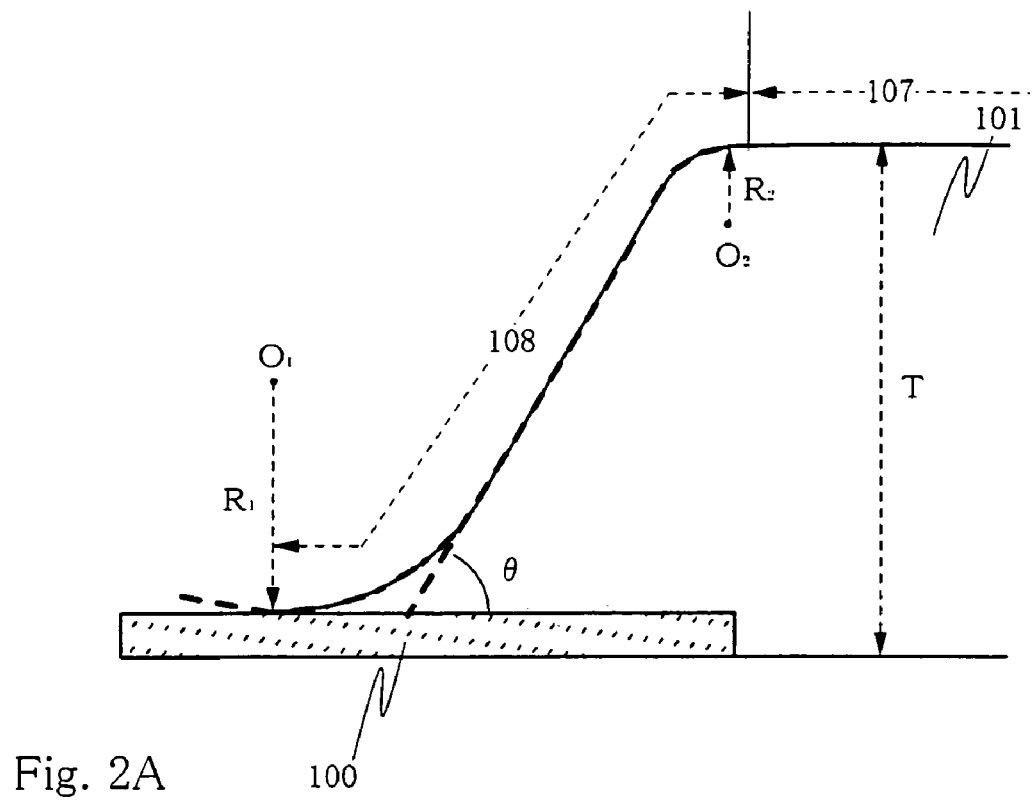
FIGS. 2A and 2B are cross-sectional views of the bump in accordance with the present invention.
Figure 2B:
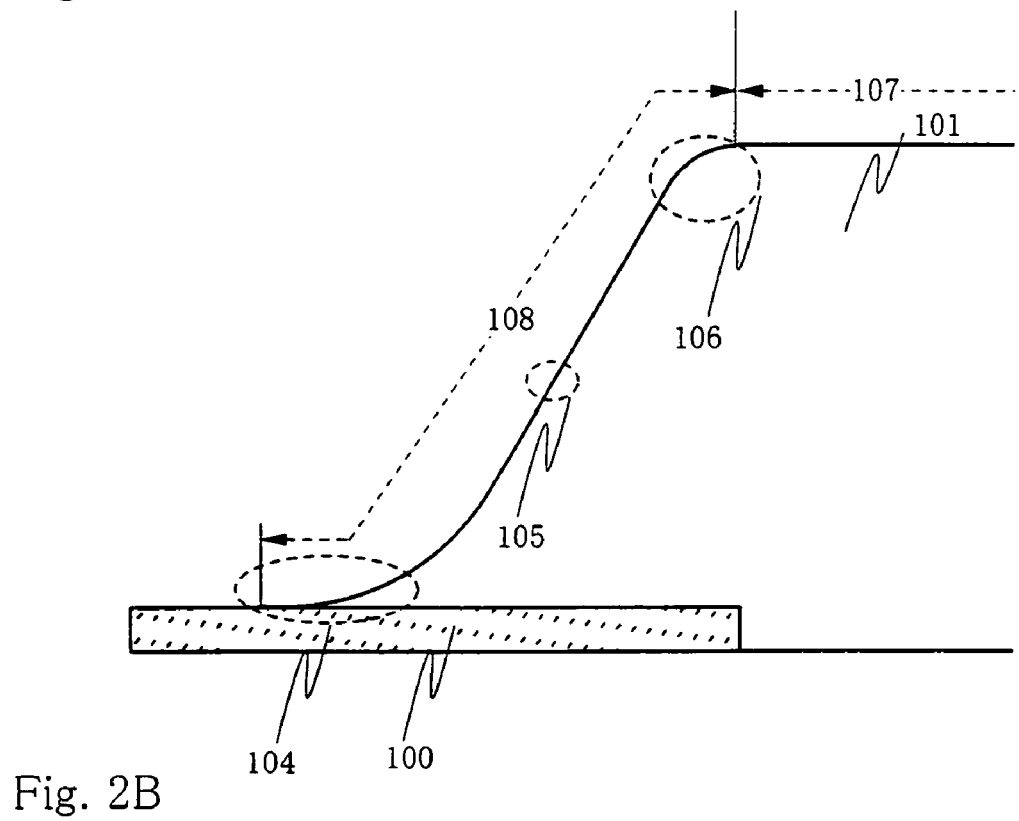
Figures 3A, 3B:
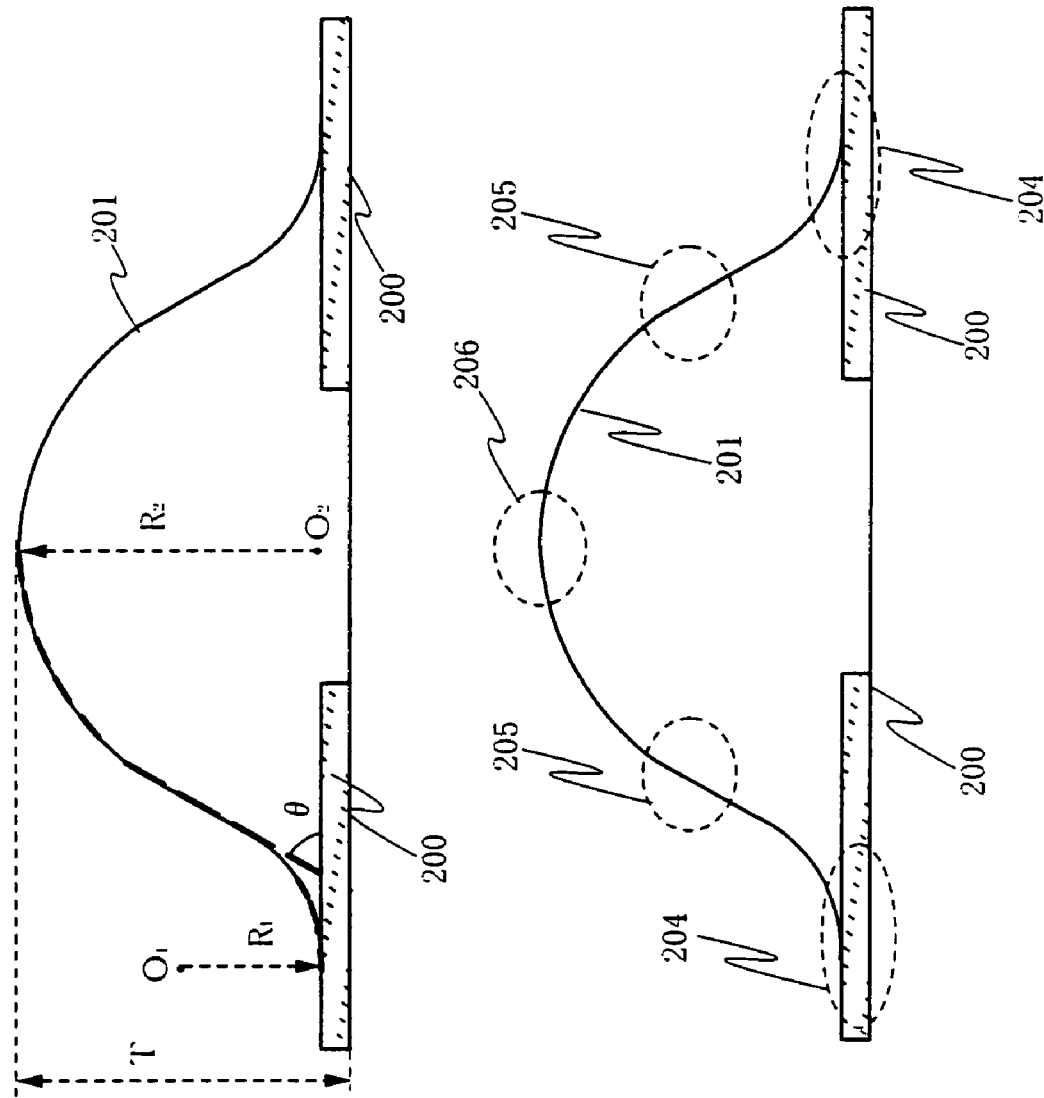
FIGS. 3A and 3B are cross-sectional views of the bump in accordance with the present invention.

Another example of the fabrication method in which the sectional profile shown in FIG. 1A or FIG. 1B is formed will be described.

The fabrication method will be described with respect to a case where a photosensitive organic material is used. It is possible to smoothly form the sectional profile by performing exposure of a photosensitive material and etching using a developer. A photosensitive polyimide resin film or a photosensitive acrylic resin film may be used as an organic material. Preferably, the photosensitive organic material used is of a positive type.

Figure 7A:
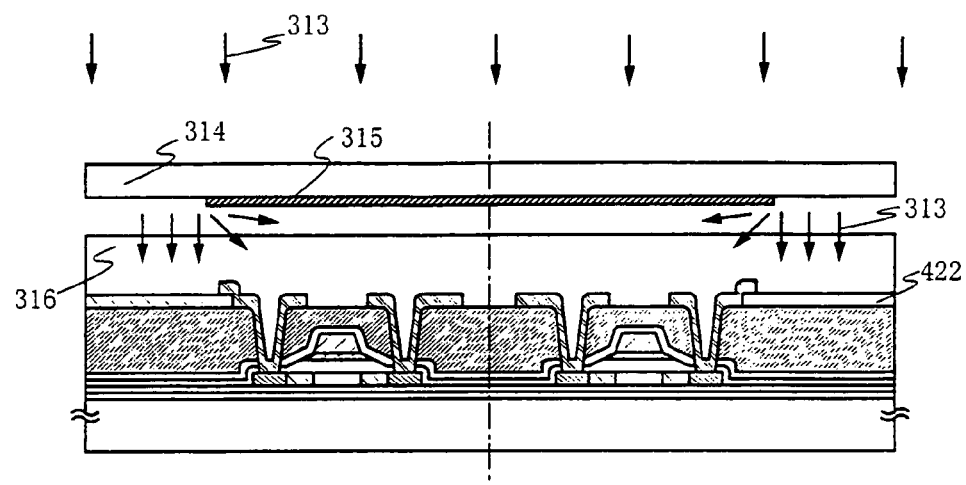
FIGS. 7A to 7C are cross-sectional views for explaining another bump fabrication process in accordance with the present invention (embodiment mode)

For example, the material of photosensitive polyimide resin film 316 is applied so that the layer of the material has a thickness of 1.0 to 3.0 µm, and is heat-treated at a temperature of 50 to 150° C. for 1 to 5 minutes, thereby removing the solvent contained in the photosensitive polyimide resin film. Thereafter, the photosensitive polyimide resin film is exposed to radiation of ultraviolet rays 313 through a photomask formed of quartz glass 314 and chromium film 315 formed on quartz glass 314 (FIG. 7A).

According to the present invention, diffraction of ultraviolet rays passed through the photomask is intentionally caused. In ordinary exposure systems, light spreading by diffraction after passage through a photomask is introduced into a lens and a substrate is placed at the position corresponding to the focal point of the lens, thereby efficiently transferring the photomask pattern to a photosensitive polyimide resin film on the substrate. In contrast, according to the present invention, the substrate is placed below the lens at a distance of about 0.05 to 30 µm from the focal point of the lens. The photosensitive polyimide resin film is irradiated with light spreading by diffraction after passage through the mask. The light (ultraviolet rays 313) radiated to the photosensitive resin penetrates by diffraction into a region inside the chromium film 315 formed on the photomask.

Figure 7B:
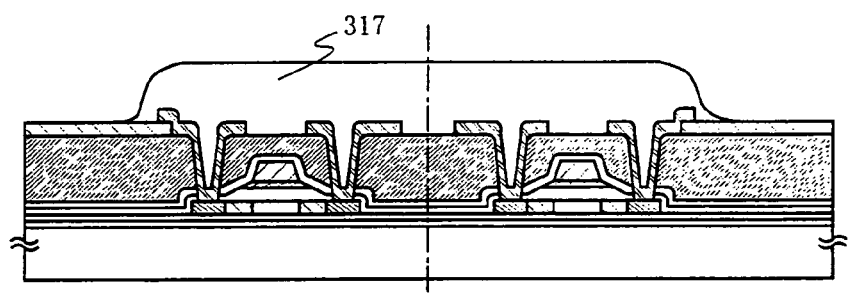

It is possible to smoothly curve the sectional profile by positively utilizing diffraction at the time of exposure of photosensitive polyimide resin film. In the profile of insulating film 317 after development, the diffracted light intensity distribution at the time of exposure is reflected. It is possible to smoothly form the surface of the insulating film by adjusting exposure and development conditions. After development, insulating film 317 is baked to be thermoset (FIG. 7B). It is also possible to form the sectional profile shown in FIG. 1B as well as that shown in FIG. 1A by causing diffracted light to reach the surface of the portion of the photosensitive resin shielded with the photomask at the time of exposure of the photosensitive resin film.

Figure 7C:
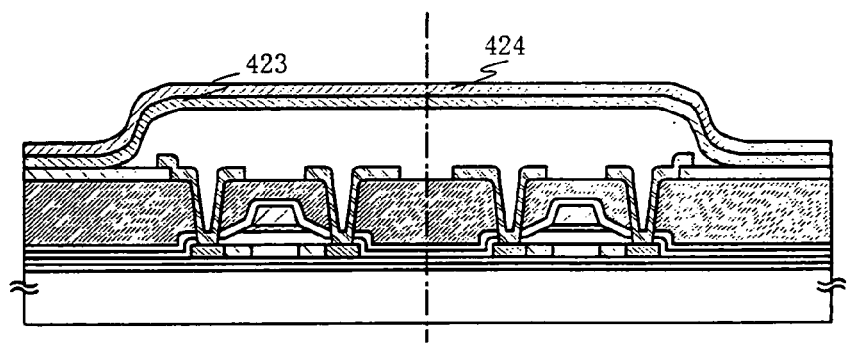

Thereafter, EL film 423 and cathode 424 are formed by deposition on the insulating film (FIG. 7C).

The etching methods mentioned above can be used generally for forming contact holes in an insulating film of an EL display device or other electronic devices such as LCDs.

The sectional profile of the bump made in the above-described embodiment mode can easily be recognized by cutting the substrate on which the bump is formed and by observing the cross section with a field-emission scanning electron microscope (SEM).

The present invention will now be described with respect to embodiments thereof in which the present invention is applied to EL display devices.

Embodiment 1

Figure 8:
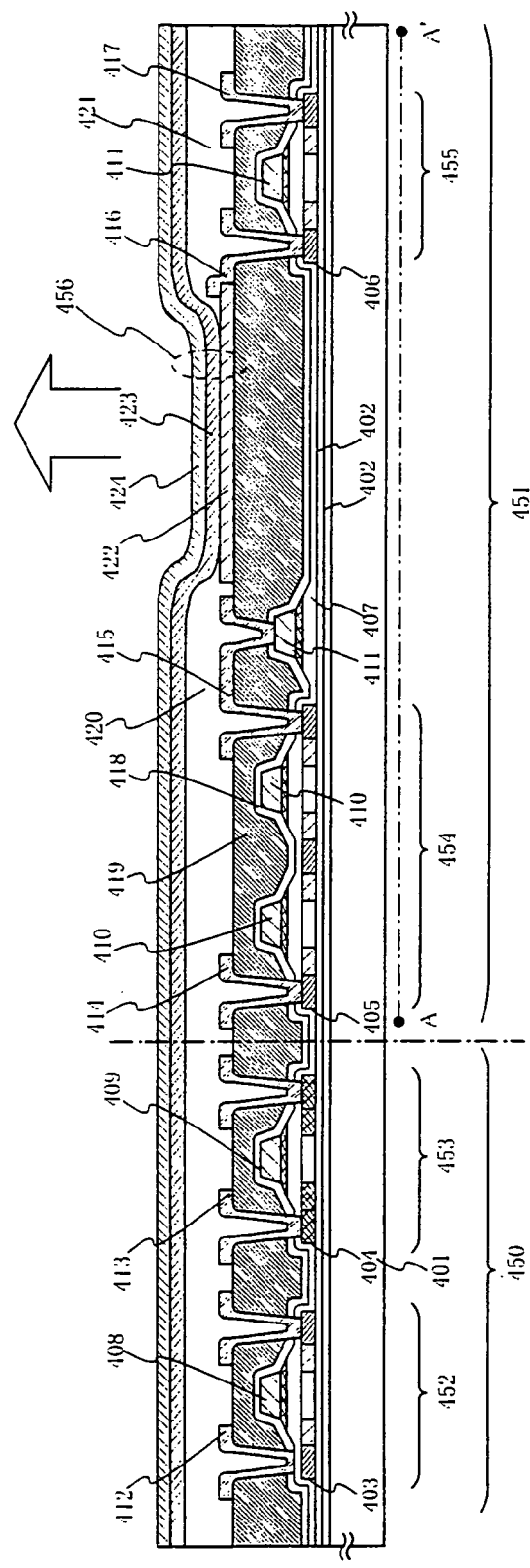
FIG. 8 is a cross-sectional view of a display device showing the construction of a drive circuit and a pixel portion (Embodiment 1)

The present invention can be applied to all display devices using EL elements. FIG. 8 shows an example of a display device using EL elements, which is an active matrix display device fabricated by using TFTS. TFTs may be separated into amorphous silicon TFTs and polysilicon TFTs according to the semiconductor film material for forming the channel forming region. However, the present invention can be applied to either of display devices using amorphous silicon TFTs and display devices using polysilicon TFTs.

FIG. 8 shows a state where an n-channel TFT 452 and a p-channel TFT 453 are formed in a drive circuit portion 450, and a switching TFT 454 and a current control TFT 455 are formed in a pixel portion 451. These TFTs are formed by using semiconductor layer lands 403 to 406, gate insulating film 407, gate electrodes 408 to 411, etc.

A substrate formed of glass such as barium borosilicate glass or alumino borosilicate glass typified by #7059 glass or #1737 glass from Corning Inc. is used as substrate 401. A quartz substrate, a silicon substrate, or a metallic substrate or a stainless steel substrate and an insulating film formed on the substrate surface may alternatively be used as substrate 401. Also, a plastic substrate having heat resistance such as to be capable of standing the heating temperature in accordance with this embodiment may also be used.

As base film 402, an insulating film such as silicon oxide film, silicon nitride film, or silicon oxynitride film may be used. In this embodiment, a two-layer structure is used as base film 402. However, a single layer of the insulating film or a structure in which two or more layers of the insulating film are laminated may alternatively be used.

An interlayer insulating film is formed of an inorganic insulating film 418 formed by silicon nitride, silicon oxynitride or the like and an organic insulating film 419 formed by an acrylic resin film, a polyimide resin film or the like.

The drive circuit portion 450 has different circuit configurations with respect to a gate signal drive circuit and a data signal drive circuit. The difference therebetween will not be explained in this specification. Wiring conductors 412 and 413 are respectively connected to n-channel TFT 452 and p-channel TFT 453. A shift register, a latch circuit, a buffer circuit, etc., are formed by using these types of TFTs.

In the pixel portion 451, a data wiring conductor 414 is connected to the source side of switching TFT 454, and a wiring conductor 415 on the drain side is connected to gate electrode 411 of current control TFT 455. The source side of current control TFT 455 is connected to a power supply wiring conductor 417, and an electrode 416 on the drain side is connected to the cathode of the EL element. FIG. 9A is a top view of the thus-constructed pixel portion. In FIG. 9A, the same reference numerals as those in FIG. 8 are used to indicate the corresponding portions. FIG. 8 is a cross-sectional view taken along line A-A' in FIG. 9A.

EL element 456 has cathode 424 formed by using a material such as MgAg or LiF, EL film 423 made by using an organic EL material, and anode 422 formed of indium-tin oxide (ITO). Bumps 420 and 421 are formed so as to cover end portions of anode 422. The bumps prevent short-circuiting between the cathode and the anode and discontinuity in cathode 424.

The bumps are formed by using an insulating film such as an acrylic resin film or a polyimide resin film so as to cover the wiring conductors of the TFT devices. In this embodiment, a photosensitive polyimide resin film is used to form the bumps. Diffraction of light for exposure of the photosensitive polyimide resin film is positively utilized to enable the surface of photosensitive polyimide resin film to be smoothly curved. The optical system in the exposure system is adjusted so as to cause diffraction.

A material for forming the EL film may be either of a low-molecular material and a high-molecular material. If a low-molecular material is used, a deposition process is performed. If a high-molecular material is used, spin coating, printing, ink jetting, or the like is performed.

As a high-molecular material for EL film, a π-conjugated polymer material, etc., are known. Typical examples of such materials are crystalline semiconductor film paraphenylene vinylene (PPV), polyvinyl carbazole (PVK), and polyfluorene. The EL film formed by using such a material is used in a single layer or laminated structure. The light emitting efficiency is improved if the EL film is used in a laminated structure. Ordinarily, a hole injection layer, a hole transport layer, a light emitting layer, and an electron transport layer are formed on the anode in this order. However, a structure formed of a hole transport layer, a light emitting layer, an electron transport layer laminated in this order, or a structure formed of a hole injection layer, a hole transport layer, a light emitting layer, an electron transport layer, and an electron injection layer may alternatively be used. According to the present invention, any of well-known EL film structures may be used and the EL film may be doped with a fluorescent pigment or the like.

Examples of organic EL materials usable in this embodiment are those disclosed in the specifications of the following U.S. Patents or Japanese Patent Laid-open Publications: U.S. Pat. Nos. 4,356,429; 4,539,507; 4,720,432; 4,769,292; 4,885,211; 4,950,950; 5,059,861; 5,047,687; 5,073,446; 5,059,862; 5,061,617; 5,151,629; 5,294,869; and 5,294,870, and Japanese Patent Application Laid-open Nos. Hei 10-189525, Hei 08-241048, and Hei 08-078159.

Generally, there are four multicolor display methods: a method in which three kinds of EL elements corresponding to red (R), green (G), and blue. (B) are formed; a method in which white light emitting EL elements and a color filter are combined; a method in which blue- or blue-green light emitting EL elements and fluorescent materials (layers of fluorescent color converting materials: CCM) are combined; and a method in which a transparent electrode is used as a cathode (counter electrode) and EL elements corresponding to RGB are superposed.

Specifically, cyanopolyphenylene may be used to form an EL film for emitting red light, polyphenylene vinylene may be used to form an EL film for emitting green light, and polyphenylene vinylene or polyalkylphenylene may be used to form an EL film for emitting blue light. The thickness of the EL film may be set to 30 to 150 nm.

The organic EL materials described above, each of which can be used to form a light emitting layer, are cited only as examples and are not exclusively used. Materials for forming a light emitting layer, a charge transport layer, and a charge injection layer are freely selected by considering possible combinations of them. The structure of the EL film used in this embodiment includes a light emitting layer and a hole injection layer formed of polythiophene (PEDOT) or polyaniline (PAni).

Cathode 424 of the EL element is provided on EL film 423. To form cathode 424, a material of a low work function containing magnesium (Mg), lithium (Li), or calcium (Ca) is used. Preferably, an electrode made of MgAg (a material in which Mg and Ag are mixed at a ratio of Mg:Ag=20:1) is used. Other examples of cathode 424 are a MgAgAl electrode, a LiAl electrode, and a LiFAl electrode.

Preferably, cathode 424 is successively formed after the formation of EL film 423 without atmospheric relief. This is because the state of the interface between cathode 424 and EL film 423 largely influences the light emitting efficiency of the EL element. In this specification, "EL element" refers to a light emitting element formed by an anode (pixel electrode), EL film and a cathode.

The laminate of EL film 423 and cathode 424 needs to be separately formed with respect to each pixel portion. Since EL film 423 is extremely easily affected by water, ordinary photolithographic techniques cannot be used. Also, cathode 424 formed by using an alkali metal can oxidizes easily. Therefore it is preferred that the laminate be selectively formed by a vapor-phase method such as vacuum deposition, sputtering or plasma chemical vapor deposition (plasma CVD) and by using a physical mask member such as a metallic mask. As a method of selectively forming the EL film, an ink jet method or screen printing method may be used. Presently, however, each of these methods cannot be used to perform a continuous process in which the cathode is also formed. Therefore the above-described vapor-phase method is more preferable.

A protective electrode for protection against water from the outside, etc., may be laminated on cathode 424. To form the protective electrode, a low-resistance material containing aluminum (Al), copper (Cu) or silver (Ag) is preferably used. Alternatively, a transparent electrode may be used to enable emission of light in the direction of the arrow shown in FIG. 8 (which emission will be referred to as "topside emission" for convenience sake). In such a case, if a black pigment is mixed in organic resin interlayer insulating film 419, the screen can be made black without a polarizing plate when the EL element does not emit light. Also, this protective electrode can be expected to have a heat release effect for releasing heat produced by the EL film. Also, it is effective to continuously perform the process including forming the protective electrode without atmospheric relief after the formation of EL film 423 and cathode 424.

Figure 17:
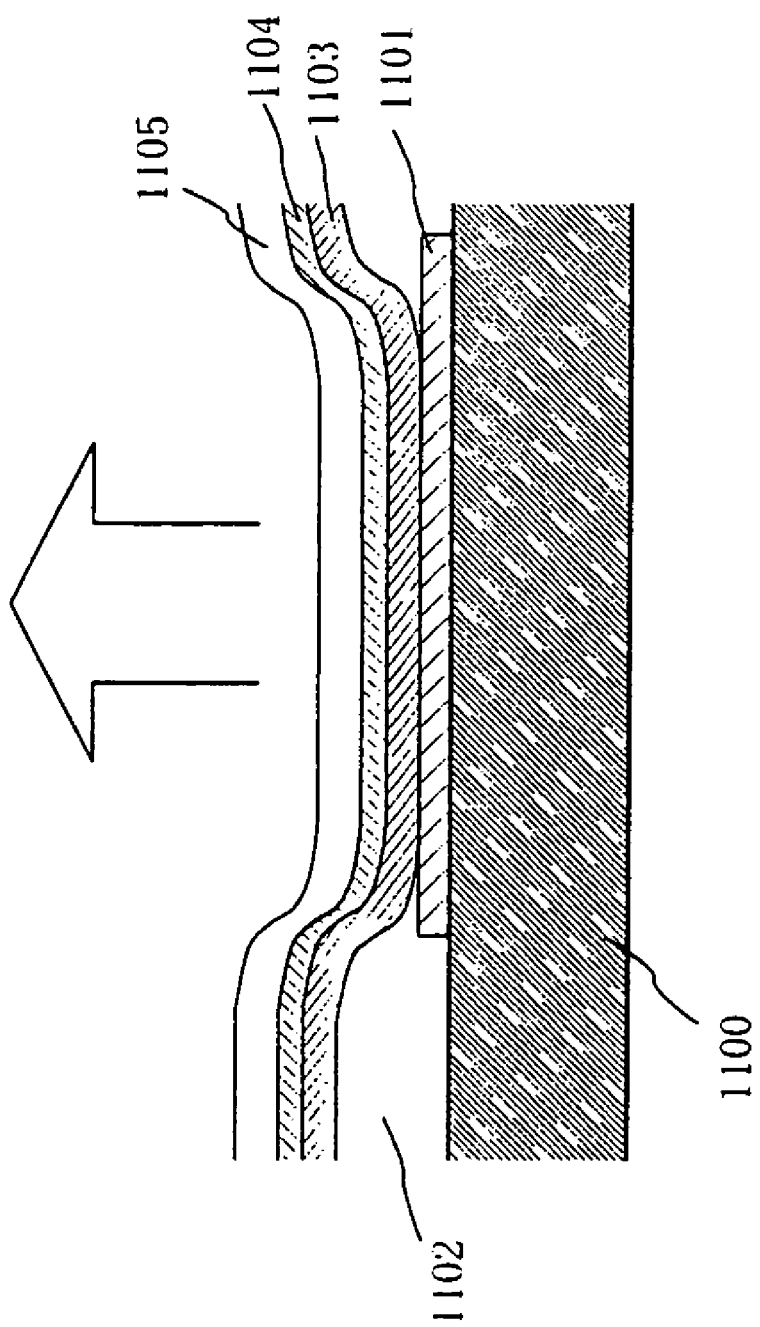
FIG. 17 is a diagram showing the direction of emission of light from the EL element (Embodiment 1)

As shown in FIG. 17, a transparent conductive film is formed as anode 1101 on organic resin interlayer insulating film 1100 in which a black pigment is mixed, and bumps 1102 formed of insulating film and EL film 1103 are formed. A film of LiFAl or MgAg having a thickness of 1 to 50 nm is then formed as cathode 1104 so that cathode 1104 can transmit light. Further, transparent conductive film 1105 is formed on the cathode for the purpose of reducing the wiring resistance. The EL element thus formed can emit light in the direction of the arrow in FIG. 17. Since the cathode is transparent, the glare of the display screen when light is not emitted can be reduced.

Referring to FIG. 8, switching TFT 454 has a multigate structure and a lightly doped drain (LDD) is provided in current control TFT 455, the LDD overlapping the gate electrode. A TFT using polysilicon can degrade easily by hot carrier injection since it has a high operating speed. Therefore forming TFIs of different structures relating to functions (a switching TFT of a sufficiently small off current and a current control TFT resistant to hot carrier injection) in one pixel portion is highly advantageous in fabricating a display device having high reliability and capable of good image display (having high operating performance).

Figure 9B:
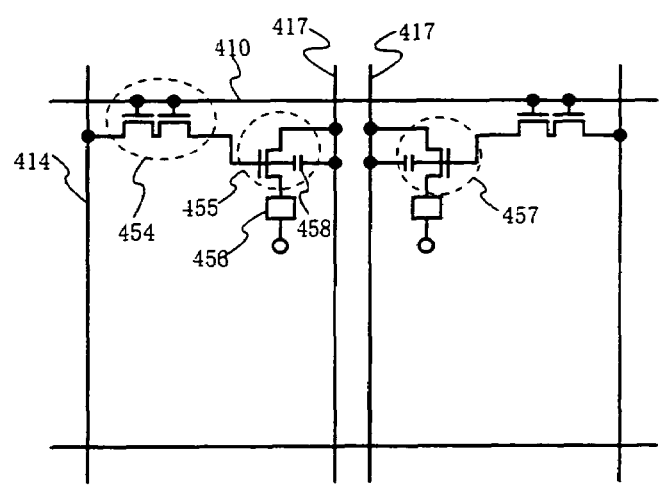

FIG. 9B is a circuit diagram of the pixel portion shown in FIG. 8 and FIG. 9A. The pixel portion is placed in the vicinity of the point of intersection of a gate wiring line and a data wiring line. The pixel portion is provided with switching TFT 454, current control TFT 455, and EL element 456.

Switching TFT 454 has its gate electrode connected to a gate wiring conductor 410. The source side of the switching TFT 454 is connected to data wiring line 414, and the drain side is connected to the gate electrode of current control TFT 455 and to one electrode of a capacitor 458. The other electrode of the capacitor is connected to power supply line 417. The source side of the current control TFT is connected to power supply line 417, and the drain side of the current control TFT is connected to EL element 456.

A device 457 is a current control TFT in the adjacent pixel portion. The source side of current control TFT 457 is connected to power supply line 417. Because common power supply line 417 can be used for each adjacent pair of pixel portion, the open area ratio can be increased.

Figure 12:
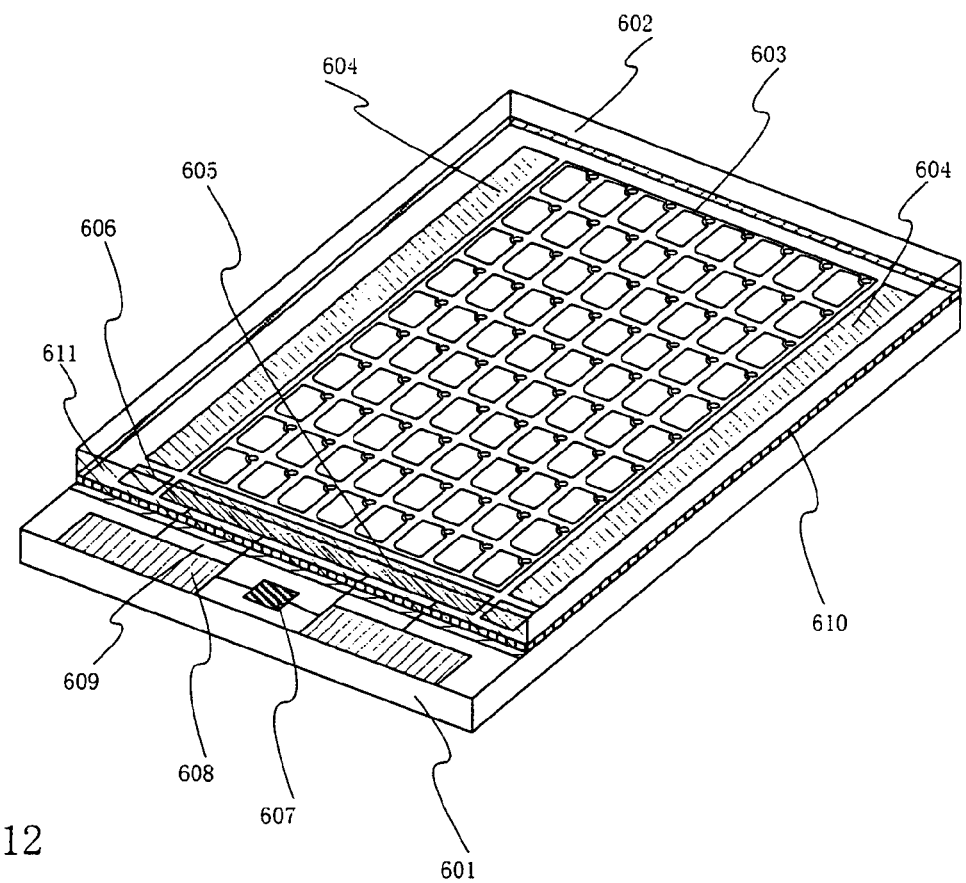
FIG. 12 is a perspective view showing an external appearance of the EL display device of the present invention (Embodiment 1)

FIG. 12 is a diagram showing an external appearance of a display device constructed in the above-described manner. The direction in which light is emitted for display is determined according to the construction of the EL element. In this display device, light is emitted upward to perform display. In the arrangement shown in FIG. 12, a device substrate 601 on which drive circuit portions 604 and 605 and a pixel portion 603 are formed by using TFTs and a substrate sealing plate 602 are bonded together by a sealing material 610. Input terminals 608 are provided on one end of the device substrate 601. A flexible printed circuit (FPC) is connected to the input terminals 608. Input terminals 608 include terminals through which image data signals, various timing signals and power supplied from an external circuit are input, and which are arranged with 500 Elm pitches. Input terminals 608 are connected to the drive circuit portions by wiring 609. An IC chip 607 in which a CPU, a memory, etc., are formed as desired may be mounted on the device substrate by a chip on glass (COG) method or the like.

Figure 10:
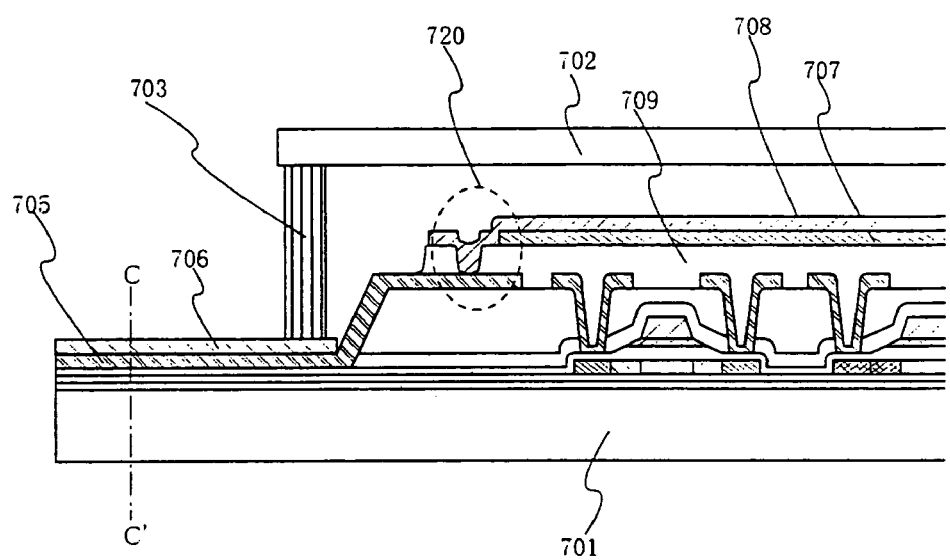
FIG. 10 is a diagram showing the construction of an input terminal portion of the display device (Embodiment 1)
Figure 11:
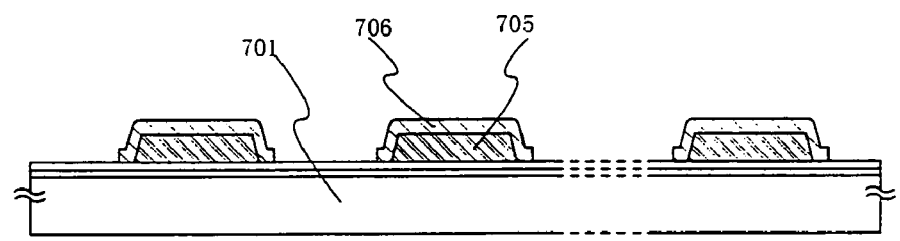
FIG. 11 is another diagram showing the construction of an input terminal portion of the display device (Embodiment 1)

As shown in FIG. 10, the input terminals are formed by laminating wiring conductors 705 made of titanium (Ti) and aluminum (Al) and ITO 706 formed as anodes. FIG. 11 is a cross-sectional view taken along line C-C' in the input terminal portion shown in FIG. 11. Device substrate 701 and substrate sealing plate 702 are bonded together by sealing material 703. In each drive circuit portion, EL film 707 and cathode 708 are formed on the bump 709, and a contact portion 720 for contact between cathode 708 and the wiring is provided, as shown in FIG. 10. Also at contact portion 720, the side surface of the bump has a smoothly curved surface, thereby preventing discontinuity in the cathode layer.

In the display device using the above-described EL elements, the side surface of each bump has a smoothly curved surface, so that discontinuity in each of the EL film and the cathode can be prevented to achieve an improvement in manufacturing yield of the display device.

Embodiment 2

Figure 13:
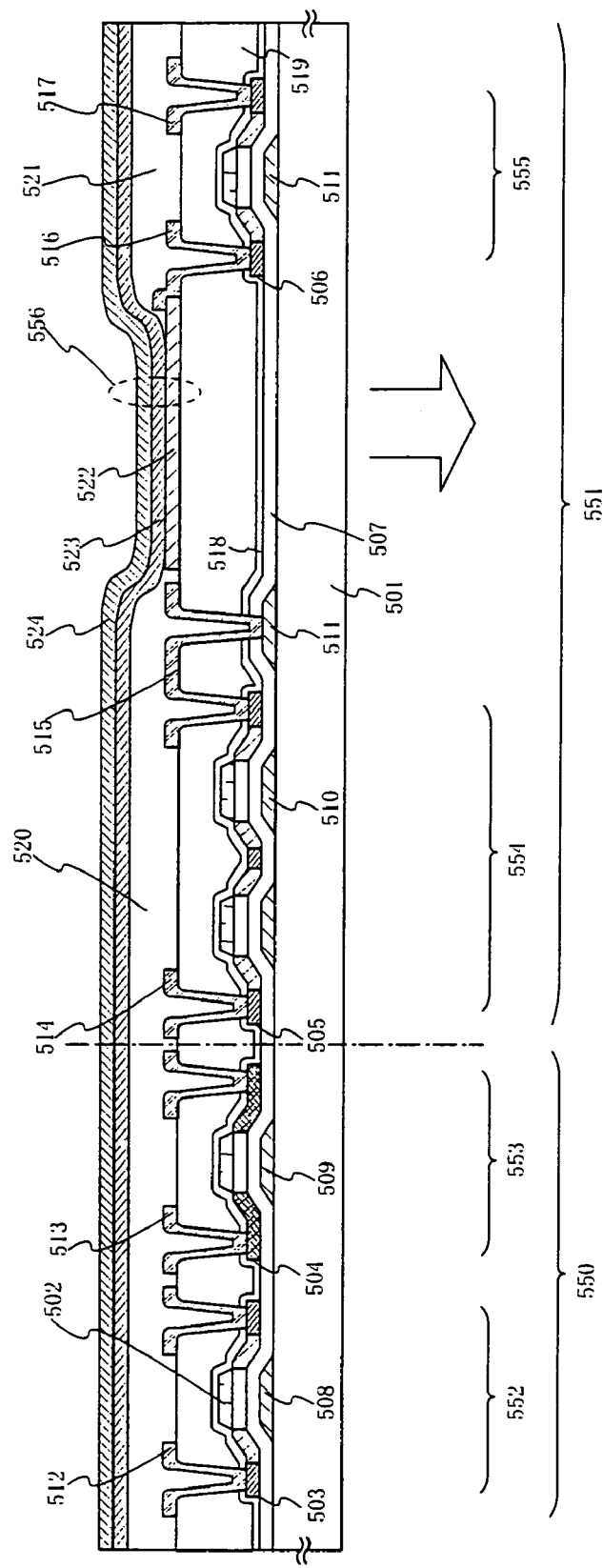
FIG. 13 is a cross-sectional view of a display device showing the construction of a drive circuit and a pixel portion (Embodiment 2)

FIG. 13 shows an example of a display device using inverse staggered TFTs. A substrate 501 and EL elements 556 used in this embodiment are the same as those of Embodiment 1, and the description for them will not be repeated.

In the inverse staggered TFTs, gate electrodes 508 to 511, gate insulating film 507, and semiconductor films 503 to 506 are formed in this order on the substrate 501. As shown in FIG. 13, n-channel TFT 552 and p-channel TFT 553 are formed in a drive circuit portion 550, and switching TFT 554, current control TFT 555 and EL element 556 are formed in a pixel portion 551. An interlayer insulating film is formed of an inorganic insulating film 518 formed by silicon nitride, silicon oxynitride or the like and an organic insulating film 519 formed by acrylic, polyimide or the like.

The drive circuit portion 550 has different circuit configurations with respect to a gate signal drive circuit and a data signal drive circuit. The difference therebetween will not be explained in this specification. Wiring conductors 512 and 513 are respectively connected to n-channel TFT 552 and p-channel TFT 553. A shift register, a latch circuit, a buffer circuit, etc., are formed by using these types of TFTS.

In the pixel portion 551, a data wiring conductor 514 is connected to the source side of switching TFT 554, and a wiring conductor 515 on the drain side is connected to gate electrode 511 of current control TFT 555. The source side of current control TFT 555 is connected to a power supply wiring conductor 517, and an electrode 516 on the drain side is connected to the anode of the EL element.

Bumps 520 and 521 are formed by using an organic resin such as acrylic or polyimide, preferably a photosensitive organic resin so as to cover the wiring conductors. Diffraction of light for exposure of the photosensitive resin is positively utilized to enable the surface of the bumps to be smoothly curved. EL element 556 has anode 522 formed of indium-tin oxide (ITO), EL film 523 made by using an organic EL material, and cathode 524 formed by using a material such as MgAg or LiF. Bumps 520 and 521 are formed so as to cover end portions of anode 522, and prevent short-circuiting between the cathode and the anode.

Anode 522 is made by using a transparent electrode and cathode 524 is made by using a metallic material of a low work function containing magnesium (Mg), lithium (Li), or calcium (Ca), so that light is radiated in the direction of the arrow shown in FIG. 13. The direction in which light is radiated can be determined as desired by making the cathode reflective or non-reflective.

Except for the TFT structure, the construction of the pixel portion and the construction of the display device are the same as those in Embodiment 1. The inverse staggered TFT using polysilicon has the advantage of being fabricated by the fabrication line for amorphous silicon TFTs (ordinarily formed as inverse staggered TFTs). Needless to say, polysilicon TFTs can be fabricated at a process temperature equal to or lower than 300° C. if laser annealing technique using excimer laser is used.

Embodiment 3

An example of an electronic device using the display device described above as Embodiment 1 will be described with reference to FIG. 14. In the display device shown in FIG. 14, TFTs formed on a substrate constitute a pixel portion 921 having pixel portion 920, a data signal drive circuit 915 used to drive the pixel portion, and a gate signal drive circuit 914. The data signal drive circuit 915 is shown as an example of a digital drive and is constituted by a shift register 916, latch circuits 917 and 918, and a buffer circuit 919. The gate signal drive circuit 914 has a shift register, a buffer, etc., (each not shown).

The pixel portion 921 has 640 (in horizontal direction)× 480 (in vertical direction) pixel portion if it is of the Video Graphics Array (VGA) type. As described above with reference to FIG. 8 or FIGS. 9A and 9B, a switching TFT and a current control TFT are provided in each pixel portion. Each EL element operates in such a manner that when the gate wiring line is selected, the gate of the switching TFT is opened to store in the capacitor a data signal from the source wiring and to open the gate of the current control TFT. That is, a current is caused to flow through the current control TFT according to the data signal input through the source wiring, thereby causing the EL element to emit light.

Figure 14:
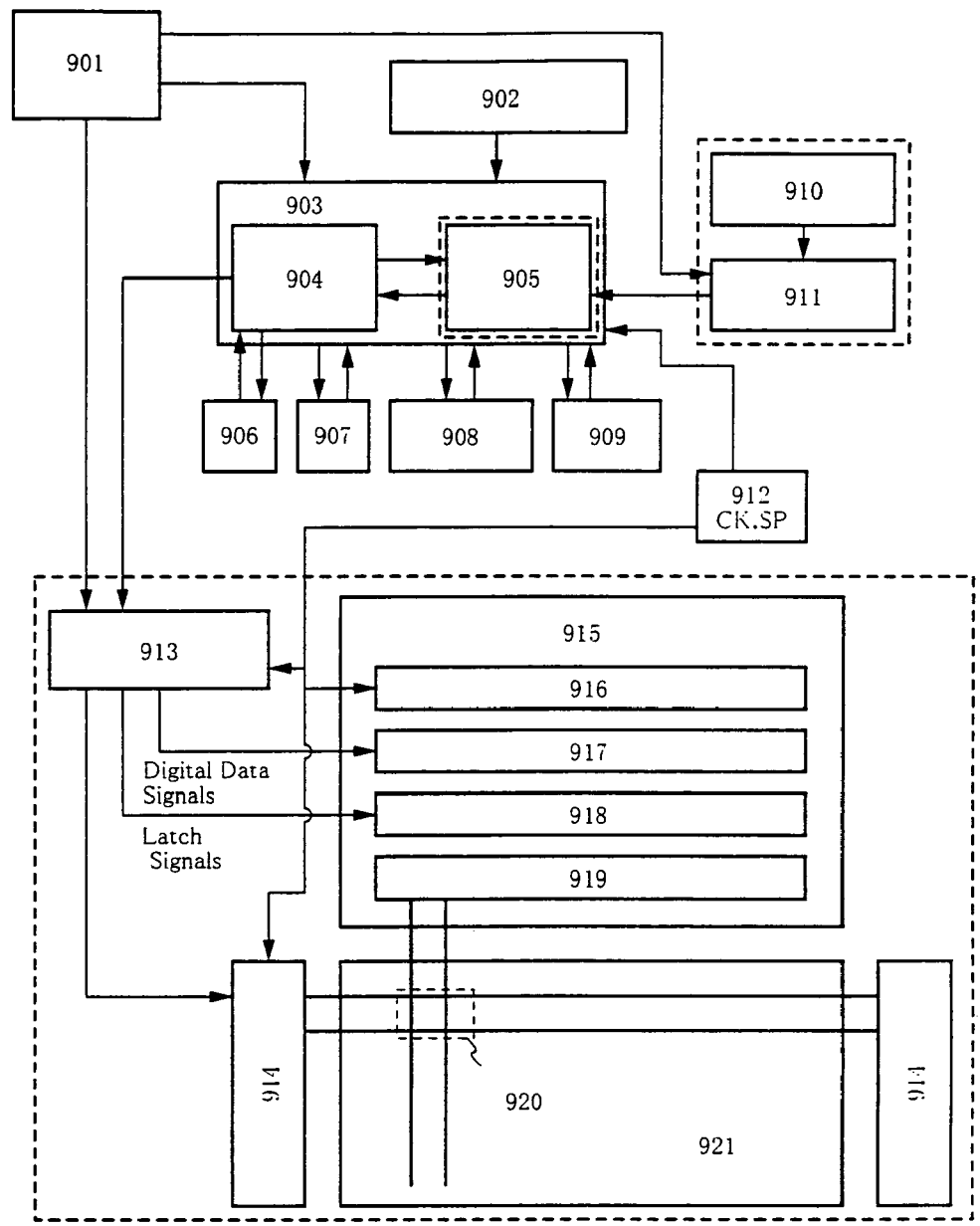
FIG. 14 is a system block diagram of an electronic device incorporating a display device (Embodiment 3)

The system block diagram of FIG. 14 shows the configuration of a portable information terminal, i.e., a personal data assistant (PDA) or the like. In the display device described above as Embodiment 1, pixel portion 921, gate signal drive circuit 914 and data signal drive circuit 915 are formed.

An external circuit connected to the display device has a power supply circuit 901 constituted by a stabilized power supply, a high-speed accurate operational amplifier, etc., an external interface port 902 including a universal serial bus (USB) terminal, a central processing unit (CPU) 903, a pen input tablet 910 and detection circuit 911 used as input means, a clock signal oscillator 912, and a control circuit 913.

The CPU 903 incorporates a video signal processing circuit 904, a tablet interface 905 for inputting signals from the pen input tablet 910, etc. A video random-access memory (VRAM) 906, a dynamic RAM (DRAM) 907, a flash memory 908, and a memory card 909 are connected to the CPU 903. Information processed by the CPU 903 is output as video signal (data signal) from the video signal processing circuit 904 to the control circuit 913. The control circuit 913 has the function of converting the video signal and clock in conformity with the timing specifications of the data signal drive circuit 915 and the gate signal drive circuit 914.

More specifically, the control circuit 913 has the function of distributing the video signal by separating it into data items in correspondence with the pixel portion of the display device, and the function of converting horizontal and vertical sync signals externally supplied into a drive circuit starting signal and a signal for controlling timing of alternating current generation in the incorporated power supply circuit.

It is desirable that portable information terminals such as PDAs be usable outdoors or in a railroad car or the like for a long time period by being supplied with power from a rechargeable battery without being inserted into a convenience receptacle. Also, importance is attached to the portability of such electronic devices and there is a need to reduce both the weight and the size. The weight of the battery, which makes up a large proportion of the total weight of each of such electronic devices, is increased when the capacity of the battery is increased. Therefore, to reduce the power consumption of such electronic devices, it is necessary to also adopt software measures, e.g., controlling the lighting time of the backlight and setting a standby mode.

For example, if during a certain time period no input signal to be supplied to the CPU 903 is input from the pen input tablet 910 to the tablet interface 905, the device is set in a standby mode and the operations of the portions indicated in the broken line boxes in FIG. 14 are stopped in synchronization with each other. In the display device, the light emission intensity of the EL elements is reduced or the display operation itself is stopped. Alternatively, memories are provided in correspondence with the pixel portion and a static image display mode is selected when necessary. The power consumption of the electronic device is thus reduced.

When a static image is displayed, the functions of the video signal processing circuit 904 of the CPU 903, the VRAM 906, etc., are stopped to reduce the power consumption. In FIG. 14, the operating portions are indicated by the broken lines. The controller 913 may be constituted by an IC chip and mounted on the device substrate by the COG method, as shown in FIG. 12, or may be integrally formed in the display device.

Embodiment 4

An example of use of an organic compound capable of emitting light by singlets (hereinafter referred to as "singlet compound") and another organic compound capable of emitting light by triplets (hereinafter referred to as "triplet compound") in EL film will be described as Embodiment 4. "Singlet compound" refers to a chemical compound which emits light only through singlet excitation, and "triplet compound" refers to a chemical compound which emits light through triplet excitation.

Typical examples of triplet compounds are organic compounds described in the following papers: (1) T. Tsutsui, C. Adachi, S. Saito, Photochemical Processes in Organized Molecular Systems, ed. K-Honda, (Elsevier Sci. Pub., Tokyo, 1991) p.437, (2) M. A. Baldo, D. F. O'Brien, Y. You, A. Shoustikov, S. Sibley, M. E. Thompson, S. R. Forrest, Nature 395 (1998) p.151, in which organic chemical compounds expressed by formulae shown below are disclosed, (3) M. A. Baldo, S. Lamansky, P. E. Burrows, M. E. Thompson, S. R. Forrest, Appl. Phys. Lett., 75 (1999) p.4, and (4) T. Tsutsui, M.-J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.

It is thought that not only the luminous materials described in the above-described papers but also luminous materials expressed by the following molecular formulae (specifically, metal complexes or organic compounds) can be used.

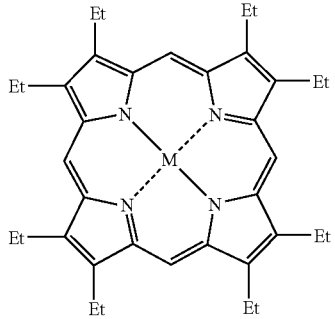

Formula 1

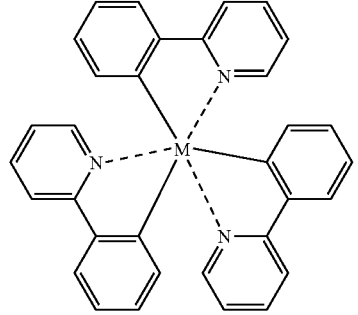

Formula 2

In the molecular formulae shown above, M represents an element belonging to the eight to tenth groups in the periodic table. Et represents an ethyl group. According to the above paper, platinum or iridium is used. The inventors of the present invention consider, from the viewpoint of reducing the manufacturing cost of the light emitting device, that nickel, cobalt or palladium is more preferable since they are low-priced in comparison with platinum and iridium. In particular, nickel is considered preferable because it can easily form a complex and contributes to high producibility.

The above-described triplet compounds have higher emission efficiency that of singlet compounds and make it possible to reduce the operating voltage (the voltage necessary for causing the EL element to emit light) while the same luminance is maintained. In this embodiment, this characteristic is utilized.

In a case where low-molecular organic compounds are used to form light emitting layers, the life of the light emitting layer for emitting red light is shorter than those of the light emitting layers for emitting light in other colors. This is because the light emission efficiency with respect to red is lower than that with respect to other colors, and because it is necessary to increase the operating voltage to obtain the same luminance as other colors, which accelerates degradation.

In this embodiment, however, a triplet compound of high emission efficiency is used as a material for forming a light emitting layer for emitting red light, thereby enabling the operating voltage for the red light emitting layer to be set closer to the operating voltages for the green light emitting layer and the blue light emitting layer while obtaining the same luminance. As a result, considerable acceleration of degradation of the red light emitting layer can be prevented and it is possible to perform multicolor display without a color shift problem or the like. A reduction in the operating voltage is favorable also because the withstand voltage margin of the transistors can be set lower.

While the embodiment has been described with respect to a case where a triplet compound is used in the red light emitting layer, it is also possible to use a triplet compound in the green light emitting layer or the blue light emitting layer.

In the case of RGB color display, there is a need to provide the pixel portion with EL elements for emitting red light, EL elements for emitting green light, and EL elements for emitting blue light. In this case, the arrangement may be such that a triplet compound is used to form the EL elements for emitting red light while the other EL elements are formed by using singlet compounds.

Thus, triplet compounds and singlet compounds are properly used to enable all the EL elements to operate at the same operating voltage (equal to or lower than 20V, preferably 3 to 20 V). Advantageously, the necessary power supply voltages for the display can be unified into 3 or 5 V to improve the facility with which the circuit is designed. A combination of the arrangement of this embodiment and any of the arrangements of Embodiments 1 to 3 may be selected and implemented.

Embodiment 5

A light-emitting device formed by implementing the present invention can be incorporated to various electric-equipment, and a pixel portion is used as an image display portion. Given as such electronic equipment of the present invention are cellular phones, PDAs, electronic books, video cameras, notebook computers, and image play back devices with the recording medium, for example, DVD (digital versatile disc), digital cameras, and the like. Specific examples of those are shown in FIGS. 15A to 16D.

Figure 15A:
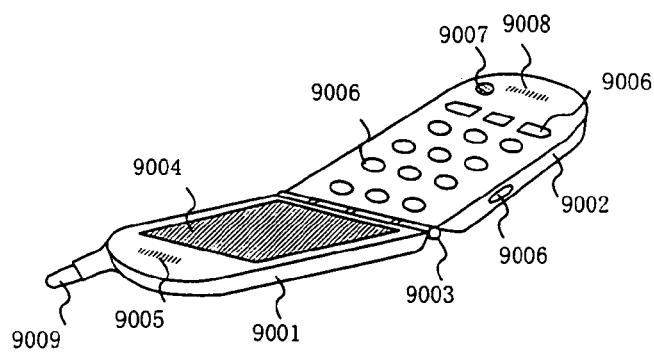
FIGS. 15A to 15E are diagrams showing examples of electronic devices (Embodiment 5)

FIG. 15A shows a cellular phone, which is composed of a display panel 9001, an operation panel 9002, and a connecting portion 9003. The display panel 9001 is provided with a display device 9004, an audio output portion 9005, an antenna 9009, etc. The operation panel 9002 is provided with operation keys 9006, a power supply switch 9007, an audio input portion 9008, etc. The present invention is applicable to the display device 9004.

Figure 15B:
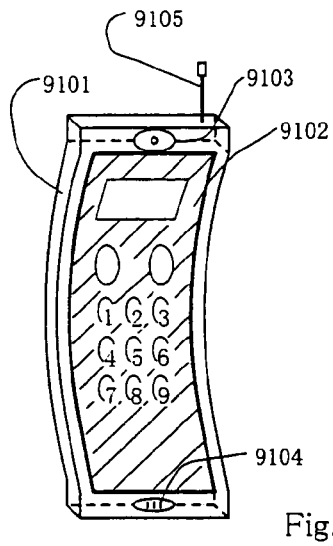

FIG. 15B also shows a cellular phone, which is composed of a main body or a housing 9101, a display device 9102, an audio output portion 9103, an audio input portion 9104, and an antenna 9105. The display device 9102 can be provided with a touch sensor so as to operate buttons on the display. In this embodiment, by using the display device formed the TFT element and the EL element on the plastic substrate, the substrate can be bent after the completion of the display device. Therefore, while such characteristics are used, the housing with 3 dimensional curing surfaces, which is designed based on the human engineering can be employed by the display device without difficulty.

Figure 15C:
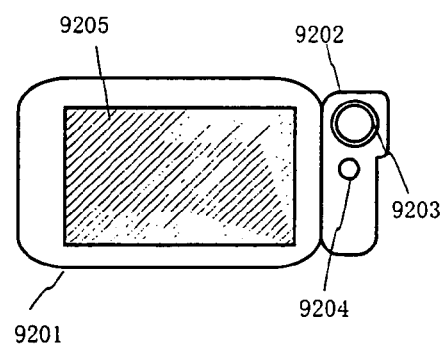

FIG. 15C shows a mobile computer, or a portable information terminal, which is composed of a main body 9201, a camera portion 9202, an image receiving portion 9203, operation switches 9204, and a display device 9205. The present invention can be applied to the display device 9205. In such electronic devices, the display device of 3 to 5 inches is employed, however, by employing the display device of the present invention, the reduction of the weight in the portable information terminal can be attained.

Figure 15D:
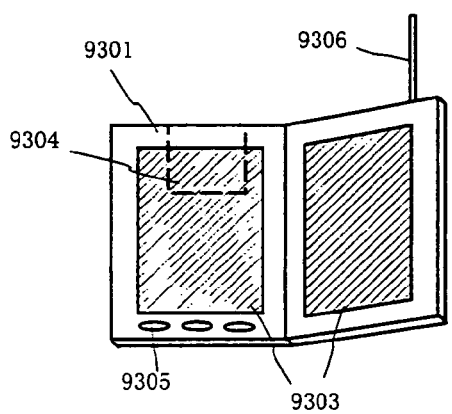

FIG. 15D shows a portable book, which is composed of a main body 9301, display devices 9303, and a recording medium 9304, an operation switch 9305, and an antenna 9306, and which displays the data recorded in MD or DVD and the data received by the antenna. The present invention can be applied to the display devices 9303. In the portable book, the display device of the 4 to 12 inches is employed. However, by employing the display device of the present invention, the reduction of the weight and thickness in the portable book can be attained.

Figure 15E:
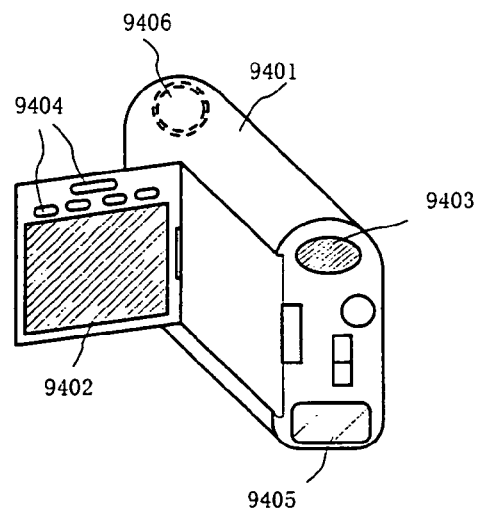

FIG. 15E shows a video camera, which is composed of a main body 9401, a display device 9402, an audio input portion 9403, operation switches 9404, a battery 9405, and the like. The present invention can be applied to the display device 9402.

Figure 16A:
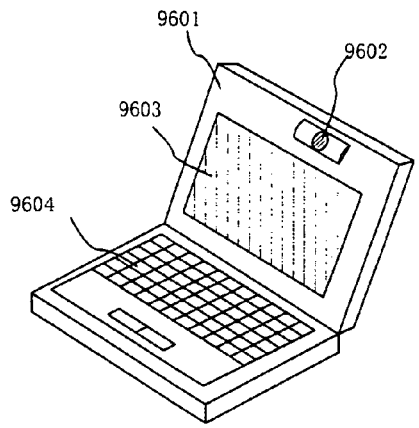
FIGS. 16A to 16D are diagrams showing examples of electronic devices (Embodiment 5)

FIG. 16A shows a personal computer, which is composed of a main body 9601, an image input portion 9602, a display device 9603, and a key board 9604. The present invention can be applied to the display device 9603.

Figure 16B:
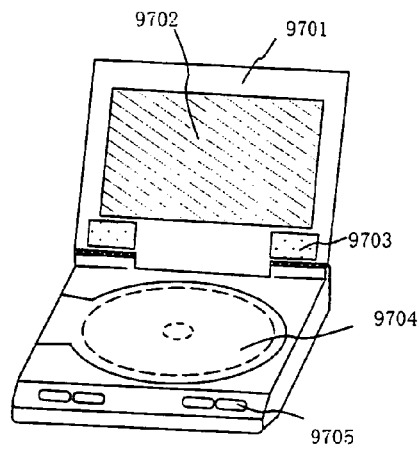

FIG. 16B shows a player employing a recording medium with programs recorded thereon (hereinafter referred to as recording medium), which is composed of a main body 9701, a display device 9702, a speaker portion 9703, a recording medium 9704, and an operation switch 9705. The device employs DVD (digital versatile disc), CD, etc. as the recording medium so that music can be listened, movies can be seen and games and Internet can be done. The present invention can be applied to the display device 9702.

Figure 16C:
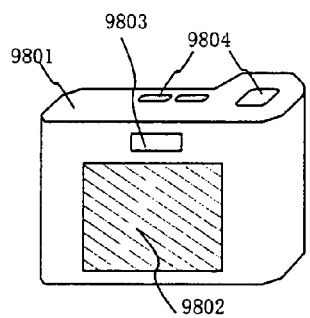

FIG. 16C shows a digital camera, which is composed of a main body 9801, a display device 9802, an eyepiece portion 9803, an operation switch 9804, and an image receiving portion (not shown). The present invention can be applied to the display device 9802.

Figure 16D:
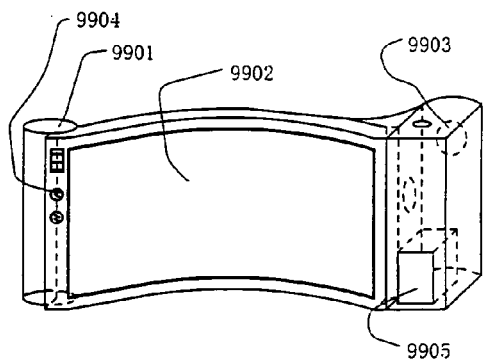

FIG. 16D also shows a digital camera, which is composed of a main body 9901, a display device 9902, an image receiving portion 9903, an operation switch 9904, a battery 9905, etc. The present invention can be applied to the display device 9902. By using the organic resin substrate of the present invention, the substrate can be bent after the completion of the display device. Therefore, while such characteristics are used, the housing with 3 dimensional curing surfaces, which is designed based on the human engineering can be employed by the display device without difficulty.

In the operation of the cellular phones shown in FIGS. 15A and 15B, luminance is raised when the operation keys are used, and the luminance is lowered after usage of the operation switch, whereby the low power consumption can be realized. Further, the luminance of the display device is raised at the receipt of a call, and the luminance is lowered during a call, whereby the low power consumption can be realized. Besides, in the case where the cellular phone is continuously used, the cellular phone is provided with a function of turning off a display by time control without resetting, whereby the low power consumption can be realized. Note that the above operations may be conducted by manual control.

The present invention can be applied to the display device which is employed in a navigation system, a refrigerator, a washing machine, a micro-wave oven, a telephone, a fax machine, etc. As described above, the applicable range of the present invention is so wide that the present invention can be applied to various products.

In a display device using EL elements according to the present invention, the occurrence of discontinuity in an EL film and a cathode is prevented, and the yield and the image quality of EL elements are improved by improving the uniformity in thickness of a cathode and an EL film formed on a bump whose side surface over an electrode is formed like the curved profile.

What is claimed is:

1. A display device comprising:
    a first electrode on an insulating surface over a substrate;
    a data wiring over said substrate;
    an electroluminescence film on said first electrode;
    a second electrode on said electroluminescence film; and
    a bump selectively formed for covering an end portion of said first electrode,
    wherein said bump has a bottom end portion contacting with an upper surface of said first electrode and a top end portion connecting continuously to a flat upper surface of said bump,
    wherein a surface of said bottom end portion is rounded, and a surface of said top end portion is rounded,
    wherein said data wiring extends along and below a portion of said bump, and
    wherein said bump comprises an organic material.
2. A display device according to claim 1, wherein an angle between a tangent of said bump and the upper surface of said first electrode changes continuously from said bottom end portion to said top end portion, said angle being within 0° to 70°.
3. A display device according to claim 1, wherein a thickness of said bump is within 1.0 to 3.0 µm.
4. A display device according to claim 1, wherein said electroluminescence film comprises an organic material.
5. A display device according to claim 1, wherein said second electrode is formed by superposed on said bottom end portion and said top end portion.
6. A display device according to claim 1, wherein one of said first electrode and said second electrode is an anode, and the other of said first electrode and said second electrode is a cathode.
7. An electronic equipment comprising said display device according to claim 1, wherein said electronic equipment is selected the group consisting of a personal computer, a video camera, a portable information terminal, a digital camera, a digital video disc player, and an electronic game machine.
8. A display device according to claim 1, wherein said data wiring is formed on said insulating surface.
9. A display device comprising:
    a first electrode on an insulating surface over a substrate;
    a data wiring over said substrate;
    an electroluminescence film on said first electrode;
    a second electrode on said electroluminescence film; and
    a bump selectively formed for covering an end portion of said first electrode,
    wherein said bump has a bottom end portion contacting with an upper surface of said first electrode, a top end portion connecting continuously to a flat upper surface of said bump, and a central portion between said bottom end portion and said top end portion,
    wherein each of said bottom end portion and a surface of said top end portion is rounded, and a tangent of said central portion has a taper angle of 35° to 70° with respect to said upper surface of said first electrode, and
    wherein said data wiring extends along and below a portion of said bump.
10. A display device according to claim 9, wherein an angle between a tangent of said bump and the upper surface of said first electrode changes continuously from said bottom end portion to said top end portion, said angle being within 0° to 70°.
11. A display device according to claim 9, wherein said bump comprises an organic material.
12. A display device according to claim 9, wherein a thickness of said bump is within 1.0 to 3.0 µm.
13. A display device according to claim 9, wherein said electroluminescence film comprises an organic material.
14. A display device according to claim 9, wherein said second electrode is formed by superposed on said bottom end portion and said top end portion.
15. A display device according to claim 9, wherein one of said first electrode and said second electrode is an anode, and the other of said first electrode and said second electrode is a cathode.
16. An electronic equipment comprising said display device according to claim 9, wherein said electronic equipment is selected the group consisting of a personal computer, a video camera, a portable information terminal, a digital camera, a digital video disc player, and an electronic game machine.
17. A display device according to claim 9, wherein said data wiring is formed on said insulating surface.
18. A display device comprising:
    a first electrode on an insulating surface over a substrate;
    a data wiring over said substrate;
    an electroluminescence film on said first electrode;
    a second electrode on said electroluminescence film; and
    a bump selectively formed for covering an end portion of said first electrode,
    wherein said bump has a bottom end portion contacting with an upper surface of said first electrode and a top end portion connecting continuously to a flat upper surface of said bump,
    wherein said bottom end portion has a curved surface having a first radius of a curvature and a center of curvature located above said first electrode, and said top end portion has a curved surface having a second radius of a curvature and a center of curvature located inside said bump, and
    wherein said data wiring extends along and below a portion of said bump.
19. A display device according to claim 18, wherein an angle between a tangent of said bump and the upper surface of said first electrode changes continuously from said bottom end portion to said top end portion, said angle being within 0° to 70°.
20. A display device according to claim 18, wherein said bump comprises an organic material.
21. A display device according to claim 18, wherein a thickness of said bump is within 1.0 to 3.0 µm.
22. A display device according to claim 18, wherein said electroluminescence film comprises an organic material.
23. A display device according to claim 18, wherein said second electrode is formed by superposed on said bottom end portion and said top end portion.
24. A display device according to claim 18, wherein one of said first electrode and said second electrode is an anode, and the other of said first electrode and said second electrode is a cathode.
25. A display device according to claim 18, wherein each of said first radius of curvature and said second radius of curvature is within 0.2 to 3.0 µm.
26. An electronic equipment comprising said display device according to claim 18, wherein said electronic equipment is selected the group consisting of a personal computer, a video camera, a portable information terminal, a digital camera, a digital video disc player, and an electronic game machine.
27. A display device according to claim 18, wherein said data wiring is formed on said insulating surface.

28. A display device comprising:
a first electrode on an insulating surface over a substrate;
a data wiring over said substrate;
an electroluminescence film on said first electrode;
a second electrode on said electroluminescence film; and
a bump selectively formed for covering an end portion of said first electrode,
wherein said bump has a bottom end portion contacting with an upper surface of said first electrode, a top end portion connecting continuously to a flat upper surface of said bump, and a central portion between said bottom end portion and said top end portion,
wherein said bottom end portion has a curved surface having a first radius of a curvature and a center of curvature located above said first electrode, said top end portion has a curved surface having a second radius of a curvature and a center of curvature located inside said bump, and a tangent of said central portion has a taper angle of 35° to 70° with respect to said upper surface of said first electrode, and
wherein said data wiring extends along and below a portion of said bump.

29. A display device according to claim 28, wherein an angle between a tangent of said bump and the upper surface of said first electrode changes continuously from said bottom end portion to said top end portion, said angle being within 0° to 70°.

30. A display device according to claim 28, wherein said bump comprises an organic material.

31. A display device according to claim 28, wherein a thickness of said bump is within 1.0 to 3.0 μm.

32. A display device according to claim 28, wherein said electroluminescence film comprises an organic material.

33. A display device according to claim 28, wherein said second electrode is formed by superposed on said bottom end portion and said top end portion.

34. A display device according to claim 28, wherein one of said first electrode and said second electrode is an anode, and the other of said first electrode and said second electrode is a cathode.

35. A display device according to claim 28, wherein each of said first radius of curvature and said second radius of curvature is within 0.2 to 3.0 μm.

36. An electronic equipment comprising said display device according to claim 28, wherein said electronic equipment is selected the group consisting of a personal computer, a video camera, a portable information terminal, a digital camera, a digital video disc player, and an electronic game machine.

37. A display device according to claim 28, wherein said data wiring is formed on said insulating surface.

38. A display device comprising:
a first electrode on an insulating surface over a substrate;
a data wiring over said substrate;
an electroluminescence film on said first electrode;
a second electrode on said electroluminescence film; and
a bump selectively formed for covering an end portion of said first electrode, said bump having a bottom end portion contacting with an upper surface of said first electrode and a top end portion connecting continuously to a flat upper surface of said bump,
wherein an angle between a tangent of said bump and the upper surface of said first electrode changes continuously from said bottom end portion to said top end portion, said angle being within 0° to 70°, and
wherein said data wiring extends along and below a portion of said bump.

39. A display device according to claim 38, wherein said bump comprises an organic material.

40. A display device according to claim 38, wherein a thickness of said bump is within 1.0 to 3.0 μm.

41. A display device according to claim 38, wherein said electroluminescence film comprises an organic material.

42. A display device according to claim 38, wherein said second electrode is formed by superposed on said bottom end portion and said top end portion.

43. A display device according to claim 38, wherein one of said first electrode and said second electrode is an anode, and the other of said first electrode and said second electrode is a cathode.

44. An electronic equipment comprising said display device according to claim 38, wherein said electronic equipment is selected the group consisting of a personal computer, a video camera, a portable information terminal, a digital camera, a digital video disc player, and an electronic game machine.

45. A display device according to claim 38, wherein said data wiring is formed on said insulating surface.

46. A display device comprising:
a first electrode on an insulating surface over a substrate;
a data wiring over said substrate;
an electroluminescence film on said first electrode;
a second electrode on said electroluminescence film; and
a bump selectively formed for covering an end portion of said first electrode,
wherein said bump has a bottom end portion contacting with an upper surface of said first electrode and a top end portion connecting continuously to a flat upper surface of said bump,
wherein said bottom end portion has an elliptic or circular surface having a center located above said first electrode, and said top end portion has an elliptic or circular surface having a center located inside said bump, and
wherein said data wiring extends along and below a portion of said bump.

47. A display device according to claim 46, wherein an angle between a tangent of said bump and the upper surface of said first electrode changes continuously from said bottom end portion to said top end portion, said angle being within 0° to 70°.

48. A display device according to claim 46, wherein said bump comprises an organic material.

49. A display device according to claim 46, wherein a thickness of said bump is within 1.0 to 3.0 μm.

50. A display device according to claim 46, wherein said electroluminescence film comprises an organic material.

51. A display device according to claim 46, wherein said second electrode is formed by superposed on said bottom end portion and said top end portion.

52. A display device according to claim 46, wherein one of said first electrode and said second electrode is an anode, and the other of said first electrode and said second electrode is a cathode.

53. An electronic equipment comprising said display device according to claim 46, wherein said electronic equipment is selected the group consisting of a personal computer, a video camera, a portable information terminal, a digital camera, a digital video disc player, and an electronic game machine.

54. A display device according to claim 46, wherein said data wiring is formed on said insulating surface.

* * * * *

UNITED STATES PATENT AND TRADEMARK OFFICE
CERTIFICATE OF CORRECTION

PATENT NO. : 7,514,868 B2  
APPLICATION NO. : 10/827709  
DATED : April 7, 2009  
INVENTOR(S) : Shunpei Yamazaki, Hideomi Suzawa and Ichiro Uehara It is certified that error appears in the above-identified patent and that said Letters Patent is hereby corrected as shown below:

On the Title Page:

Under Item (56) References Cited:

Add: --US 2005-0174051 A1; 08/11/2005; Yamazaki et al--.

--US 6,995,511 B2; 02/07/2006; Yamazaki et al--.

--US 2006-0082300 A1; 04/20/2006; Yamazaki et al--.

Signed and Sealed this

Twenty-ninth Day of September, 2009

David J. Kappos
*Director of the United States Patent and Trademark Office*